US012708058B2

(12) United States Patent
Matsubara

(10) Patent No.: US 12,708,058 B2
(45) Date of Patent: Aug. 11, 2026

(54) SEMICONDUCTOR DEVICE

(71) Applicant: ROHM CO., LTD., Kyoto (JP)

(72) Inventor: Hiroaki Matsubara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 521 days.

(21) Appl. No.: 18/248,999

(22) PCT Filed: Sep. 29, 2021

(86) PCT No.: PCT/JP2021/035772

§ 371 (c)(1),
(2) Date: Apr. 13, 2023

(87) PCT Pub. No.: WO2022/080134

PCT Pub. Date: Apr. 21, 2022

(65) Prior Publication Data

US 2023/0402353 A1 Dec. 14, 2023

(30) Foreign Application Priority Data

Oct. 16, 2020 (JP) ................................ 2020-174410

(51) Int. Cl.
*H10W 90/00* (2026.01)
*H10D 1/20* (2025.01)
(Continued)

(52) U.S. Cl.
CPC ............ *H10W 90/811* (2026.01); *H10D 1/20* (2025.01); *H10W 70/411* (2026.01);
(Continued)

(58) Field of Classification Search
CPC ........... H01L 23/49575; H01L 23/3107; H01L 23/49503; H01L 24/48; H01L 24/49;
(Continued)

(56) References Cited

U.S. PATENT DOCUMENTS

2003/0042622 A1* 3/2003 Horibe .................... H01L 24/85
257/784
2013/0154071 A1* 6/2013 Haigh ............... H01L 23/49531
257/676
(Continued)

FOREIGN PATENT DOCUMENTS

JP 7-176558 7/1995
JP 11-145179 5/1999
(Continued)

OTHER PUBLICATIONS

Office Action issued in corresponding Japanese Patent application No. 2022-557345, Jul. 8, 2025, and machine translation (17 pages).
(Continued)

*Primary Examiner* — Teresa M. Arroyo
(74) *Attorney, Agent, or Firm* — HSML P.C.

(57) ABSTRACT

A semiconductor device includes first and second circuits, and an insulator relaying signals between the first and second circuits. The first circuit includes a first pad and a first semiconductor mounted on the first pad. The second circuit includes a second pad and a second semiconductor mounted on the second pad. The insulator may be mounted on the first pad. The semiconductor device further includes wire bonded to the insulator and second semiconductor. The wire includes an upright, inclined and extended sections. The upright section rises from the insulator along a thickness direction of the first pad. The inclined section is inclined relative to the thickness direction, extending from the second semiconductor toward the insulator. The extended section is between the upright and the inclined sections. The inclination angle of the extended section to a plane perpendicular to the thickness direction is smaller than that of the inclined section.

18 Claims, 19 Drawing Sheets

(51) Int. Cl.

| | |
|---|---|
| ***H10W 70/40*** | (2026.01) |
| ***H10W 72/00*** | (2026.01) |
| ***H10W 72/50*** | (2026.01) |
| ***H10W 74/10*** | (2026.01) |

(52) U.S. Cl.
CPC .... *H10W 74/111* (2026.01); *H10W 72/07553* (2026.01); *H10W 72/537* (2026.01); *H10W 90/755* (2026.01); *H10W 90/759* (2026.01)

(58) Field of Classification Search
CPC . H01L 2224/48091; H01L 2224/48175; H01L 2224/48195; H01L 2224/49052; H01L 23/291; H01L 23/3171; H01L 23/3192; H01L 23/4952; H01L 23/49589; H01L 25/16; H01L 23/49562; H01L 2224/02166; H01L 2224/32245; H01L 2224/4809; H01L 2224/48137; H01L 2224/48247; H01L 2224/48257; H01L 2224/73265; H01L 2924/181; H01L 21/60; H01L 23/50; H10D 1/20
See application file for complete search history.

(56) References Cited

U.S. PATENT DOCUMENTS

| | | | | |
|---|---|---|---|---|
| 2016/0268241 | A1 | 9/2016 | Yamamoto et al. | |
| 2020/0168534 | A1 | 5/2020 | Bonifield et al. | |
| 2022/0068776 | A1 * | 3/2022 | Osumi | H01L 25/072 |
| 2022/0115246 | A1 * | 4/2022 | Higashi | H01L 25/50 |

FOREIGN PATENT DOCUMENTS

| | | | | |
|---|---|---|---|---|
| JP | 2004-356382 | | 12/2004 | |
| JP | 2007048962 | A * | 2/2007 | H01L 24/97 |
| JP | 2014-155412 | | 8/2014 | |
| JP | 2016-207714 | | 12/2016 | |
| JP | 2019-62095 | A | 4/2019 | |

OTHER PUBLICATIONS

International Search Report issued in International Application No. PCT/JP2021/035772, Dec. 14, 2021, 2 pages.
Office Action issued in corresponding German Patent Application No. 11 2021 004 773.6, Feb. 14, 2024, 15 pages w/translation.
Decision of Refusal issued in corresponding Japanese Patent application No. 2022-557345, Oct. 21, 2025, and machine translation (17 pages).

* cited by examiner

SEMICONDUCTOR DEVICE

TECHNICAL FIELD

The present disclosure relates to a semiconductor device. In particular, the present disclosure relates to a semiconductor device in which signals are transmitted between a plurality of semiconductor elements through an insulating element.

BACKGROUND ART

Inverters are used in electric vehicles, hybrid vehicles, and home appliances, for example. Such an inverter may include a semiconductor device for controlling and driving, and power semiconductors such as insulated gate bipolar transistors (IGBTs) or metal oxide semiconductor field effect transistors (MOSFETs). An engine control unit (ECU) in the inverter outputs a control signal, which is then inputted to a control element of the semiconductor device. The control element converts the control signal into a PWM (Pulse Width Modulation) control signal and transmits the converted control signal to a drive element in the semiconductor device. The drive element causes, for example, six power semiconductors to perform a switching operation at a desired timing according to the PWM control signal. As a result of the switching operation of the six power semiconductors at a desired timing, DC power supplied from an on-vehicle battery is converted into three-phase AC power for motor driving. Patent Document 1 discloses an example of a semiconductor device (drive circuit) used for a motor driving device.

In the semiconductor device for controlling and driving described above, the source voltage required for the control element may be different from the source voltage required for the drive element. More specifically, there may be a difference between the value of the voltage applied to a conductive path to the control element and the value of the voltage applied to a conductive path to the drive element. In such a case, if semiconductor elements are to be mounted within a single package, the dielectric strength between these conductive paths should be improved.

PRIOR ART DOCUMENT

Patent Document

Patent Document 1: JP-A-2014-155412

SUMMARY OF THE INVENTION

Problem to be Solved by the Invention

In view of the foregoing circumstances, an object of the present disclosure is to provide a semiconductor device capable of improving dielectric strength.

Means to Solve the Problem

A semiconductor device provided by the present disclosure includes: a first die pad; a second die pad spaced apart from the first die pad in a first direction and having a different potential from the first die pad; a first semiconductor element mounted on the first die pad and constituting a first circuit together with the first die pad; a second semiconductor element mounted on the second die pad and constituting a second circuit together with the second die pad; an insulating element mounted on a specific die pad, relaying transmission and reception of a signal between the first circuit and the second circuit, and insulating the first circuit and the second circuit from each other, where one of the first die pad and the second die pad is referred to as the specific die pad and the other as a non-specific die pad, a first wire bonded to the insulating element and a specific semiconductor element, where one of the first semiconductor element and the second semiconductor element that is mounted on the non-specific die pad is referred to as the specific semiconductor element and the other mounted on the specific die pad is referred to as a non-specific semiconductor element; and a sealing resin covering the first die pad, the second die pad, the first semiconductor element, the second semiconductor element, and the insulating element, and insulating the first die pad and the second die pad from each other. The first wire bridges across a pad gap provided between the first die pad and the second die pad in the first direction. The first wire has a first upright section, a first inclined section, a first extended section, a first bent section, and a second bent section. The first upright section rises from the insulating element in a thickness direction of the first die pad. The first inclined section is inclined relative to the thickness direction and extends from the specific semiconductor element toward the insulating element. The first extended section is located between the first upright section and the first inclined section as viewed in the thickness direction. The first bent section is connected to the first upright section and the first extended section. The second bent section is connected to the first inclined section and the first extended section. An inclination angle of the first extended section relative to a plane perpendicular to the thickness direction is smaller than an inclination angle of the first inclined section relative to the plane.

Preferably, the first extended section bridges across the pad gap.

Preferably, in the thickness direction, a boundary between the first extended section and the first bent section is farther away from the insulating element than a boundary between the first extended section and the second bent section.

Preferably, as viewed in the thickness direction, a boundary between the first inclined section and the second bent section is located away from the specific semiconductor element.

Preferably, the semiconductor device further includes a second wire. The insulating element is located between the first semiconductor element and the second semiconductor element in the first direction. The second wire is bonded to the insulating element and the non-specific semiconductor element and covered with the sealing resin. The second wire has a second upright section, a second inclined section, a second extended section, a third bent section, and a fourth bent section. The second upright section rises from the insulating element in the thickness direction. The second inclined section is inclined relative to the thickness direction and extends from the non-specific semiconductor element toward the insulating element. The second extended section is located between the second upright section and the second inclined section as viewed in the thickness direction. The third bent section is connected to the second upright section and the second extended section. The fourth bent section is connected to the second inclined section and the second extended section. The second extended section is shorter than the first extended section.

Preferably, an inclination angle of the second extended section relative to the plane is smaller than an inclination angle of the second inclined section relative to the plane.

Preferably, as viewed in the thickness direction, a boundary between the second inclined section and the fourth bent section is located away from the semiconductor element mounted on the specific die pad.

Preferably, the first wire has a first tip of the first inclined section that is bonded to the specific semiconductor element, and the dimension of the first tip in the thickness direction decreases with distance from the first extended section. Preferably, the second wire has a second tip of the second inclined section that is bonded to the semiconductor element mounted on the specific die pad, and the dimension of the second tip in the thickness direction decreases with distance from the second extended section.

Preferably, when source voltages are supplied to the first circuit and the second circuit, the source voltage to the second circuit is higher than the source voltage to the first circuit.

Preferably, the semiconductor device further includes: a plurality of first terminals each including a portion located on one side in the first direction relative to the first die pad; and a plurality of second terminals each including a portion located on another side in the first direction relative to the second die pad. The plurality of first terminals are spaced apart from each other in a second direction perpendicular to the thickness direction and the first direction, and at least one of the first terminals is electrically connected to the first circuit. The plurality of second terminals are spaced apart from each other in the second direction, and at least one of the second terminals is electrically connected to the second circuit. The sealing resin has a pair of first side surfaces spaced apart from each other in the first direction, and a pair of second side surfaces spaced apart from each other in the second direction. The first terminals are exposed from one of the pair of first side surfaces, and the second terminals are exposed from another one of the pair of first side surfaces.

Preferably, the second die pad overlaps with the first die pad as viewed in the first direction.

Preferably, the first die pad, the second die pad, the plurality of the first terminals, and the plurality of second terminals are located away from the pair of second side surfaces.

Preferably, as viewed in the thickness direction, each of the first terminals includes a portion protruding from the one of the first side surfaces along the first direction. As viewed in the thickness direction, each of the second terminals includes a portion protruding from the other one of the first side surfaces along the first direction.

Preferably, the plurality of first terminals include a pair of first support terminals spaced apart from each other in the second direction. The first die pad has a pair of first edges spaced apart from each other in the second direction, and the pair of first support terminals are connected to the pair of first edges, respectively.

Preferably, the plurality of second terminals include a pair of second support terminals spaced apart from each other in the second direction. The second die pad has a pair of second edges spaced apart from each other in the second direction, and the pair of second support terminals are connected to the pair of second edges, respectively.

Preferably, the specific die pad is formed with a hole penetrating through in the thickness direction. As viewed in the thickness direction, the hole is located between the insulating element and the non-specific semiconductor element.

Preferably, the insulating element is of an inductive type.

Advantages of the Invention

The foregoing configuration allows the semiconductor device to improve dielectric strength.

Other features and advantages of the present disclosure will be more apparent from the detailed description given below with reference to the accompanying drawings.

MODE FOR CARRYING OUT THE INVENTION

Figure 1:
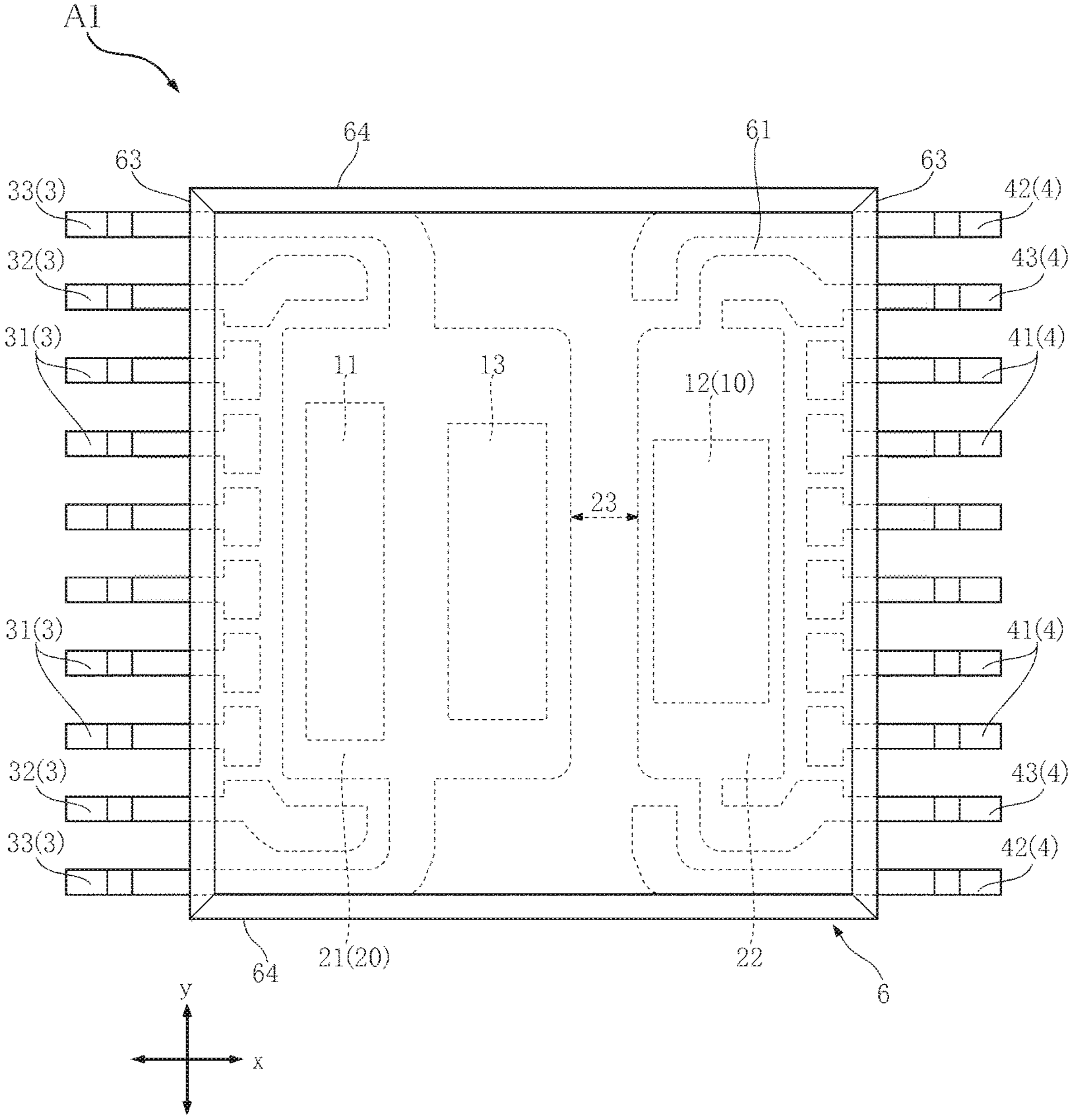
FIG. 1 is a plan view illustrating a semiconductor device according to a first embodiment of the present disclosure.

Embodiments of the present disclosure will be described with reference to the accompanying drawings.

The following describes a semiconductor device A1 according to a first embodiment of the present disclosure, with reference to FIGS. 1 to 17. A semiconductor device A1 includes a first semiconductor element 11, a second semiconductor element 12, an insulating element 13, a first die pad 21, a second die pad 22, a plurality of first terminals 3, a plurality of second terminals 4, a plurality of first wires 51, a plurality of second wires 52, a plurality of third wires 53, a plurality of fourth wires 54, and a sealing resin 6. The semiconductor device A1 is surface-mounted on the wiring board of an inverter for an electric vehicle (or a hybrid vehicle), for example. The semiconductor device A1 is in a small outline package (SOP). Note that the package type of the semiconductor device A1 is not limited to SOP. FIG. 2 shows the sealing resin 6 in phantom for convenience of understanding. In FIG. 2, the sealing resin 6 is indicated by an imaginary line (two-dot chain line).

In the following description, three mutually perpendicular directions, i.e., direction x, direction y, and direction z, will be referred to as appropriate. For example, as can be understood from FIG. 3, the direction z extends parallel to the normal line of the first die pad 21 (or the second die pad 22). In other words, the direction z extends through the thickness of the first die pad 21 (or the second die pad 22). As such, the direction z is hereinafter referred to as "thickness direction z". The direction x is hereinafter referred to as "first direction x" and the direction y as "second direction y". However, the present disclosure is not limited to this.

The first semiconductor element 11, the second semiconductor element 12, and the insulating element 13 form the functional core of the semiconductor device A1. As shown in FIG. 2, in the semiconductor device A1, each of the first semiconductor element 11, the second semiconductor element 12, and the insulating element 13 is an individual element. As viewed in the thickness direction z, each of the first semiconductor element 11, the second semiconductor element 12, and the insulating element 13 has the shape of a rectangular with its longer sides extending along the second direction y.

The first semiconductor element 11 has a circuit that converts a control signal inputted from, for example, an ECU into a PWM control signal, a transmission circuit that transmits the PWM control signal to the second semiconductor element 12, and a reception circuit that receives an electric signal from the second semiconductor element 12.

The second semiconductor element 12 has a reception circuit that receives a PWM control signal, a circuit (i.e., gate driver) that switches a switching element (e.g., an IGBT or a MOSFET) according to the PWM control signal, and a transmission circuit that transmits an electric signal to the first semiconductor element 11. The electric signal may be an output signal from a temperature sensor located near a motor.

The insulating element 13 transmits a PWM control signal or other electric signals in an electrically insulated state. In the semiconductor device A1, the insulating element 13 is of an inductive type. For example, the inductive insulating element 13 may be an insulating transformer. The insulating transformer transmits an electric signal in an electrically insulated state by inductively coupling two inductors (coils). The insulating element 13 has a substrate made of Si. Inductors made of Cu are mounted on the substrate. The inductors include a transmission inductor and a reception inductor, which are stacked in the thickness direction z. A dielectric layer made of, for example, $SiO_2$ is provided between the transmission inductor and the reception inductor. The dielectric layer electrically insulates the transmission inductor from the reception inductor. Alternatively, the insulating element 13 may be of a capacitive type. For example, the capacitive insulating element 13 may be a capacitor. Alternatively, the insulating element 13 may be a photocoupler.

In the semiconductor device A1, the second semiconductor element 12 requires a higher source voltage than the first semiconductor element 11. As a result, a high potential difference is created between the first semiconductor element 11 and the second semiconductor element 12. Accordingly, in the semiconductor device A1, a first circuit including the first semiconductor element 11 as a component and a second circuit including the second semiconductor element 12 as a component are insulated from each other by the insulating element 13. In the semiconductor device A1, the first circuit is supplied with a relatively low voltage, and the second circuit is supplied with a relatively high voltage. As such, the insulating element 13 relays the transmission and reception of signals between the first circuit and the second circuit. In the case of an inverter for an electric vehicle or a hybrid vehicle, the voltage applied to the ground of the first semiconductor element 11 is approximately V, whereas the voltage applied to the ground of the second semiconductor element 12 becomes 600 V or higher transiently.

Figure 10:
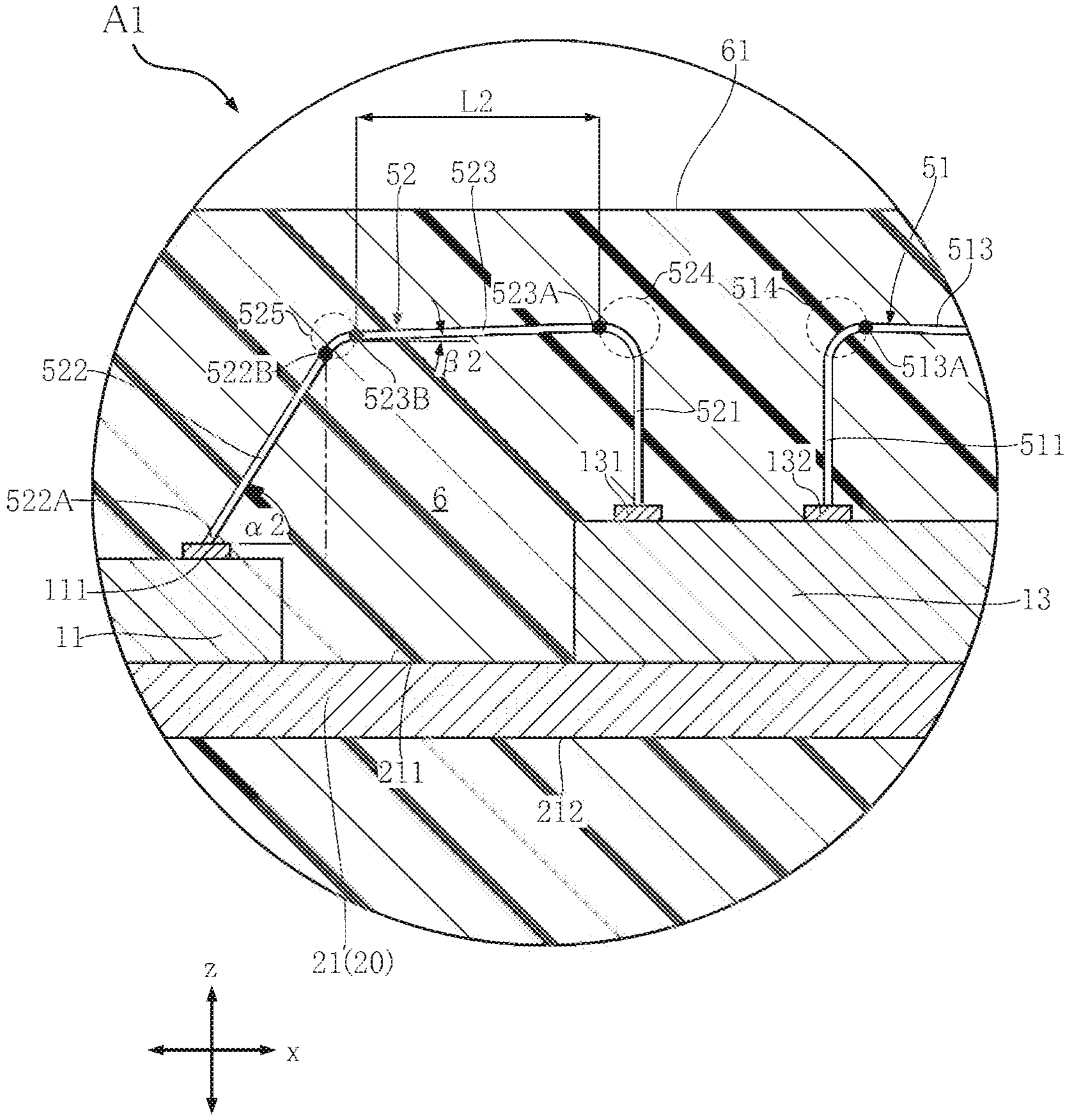
FIG. 10 is a partially enlarged view of FIG. 6.

As shown in FIGS. 2 and 10, the insulating element 13 is located between the first semiconductor element 11 and the second semiconductor element 12 in the first direction x. The first semiconductor element 11 and the insulating element 13 are mounted on the first die pad 21. The second semiconductor element 12 is mounted on the second die pad 22. For convenience of description, the die pad which is one of the first die pad 21 and the second die pad 22 and on which the insulating element 13 is mounted is referred to as "specific die pad 20". Furthermore, the semiconductor element which is one of the first semiconductor element 11 and the second semiconductor element 12 and which is mounted on a die pad different from the specific die pad 20 is referred to as "specific semiconductor element 10". In the semiconductor device A1, the first die pad 21 corresponds to the specific die pad 20, and the second semiconductor element 12 corresponds to the specific semiconductor element 10.

Figure 6:
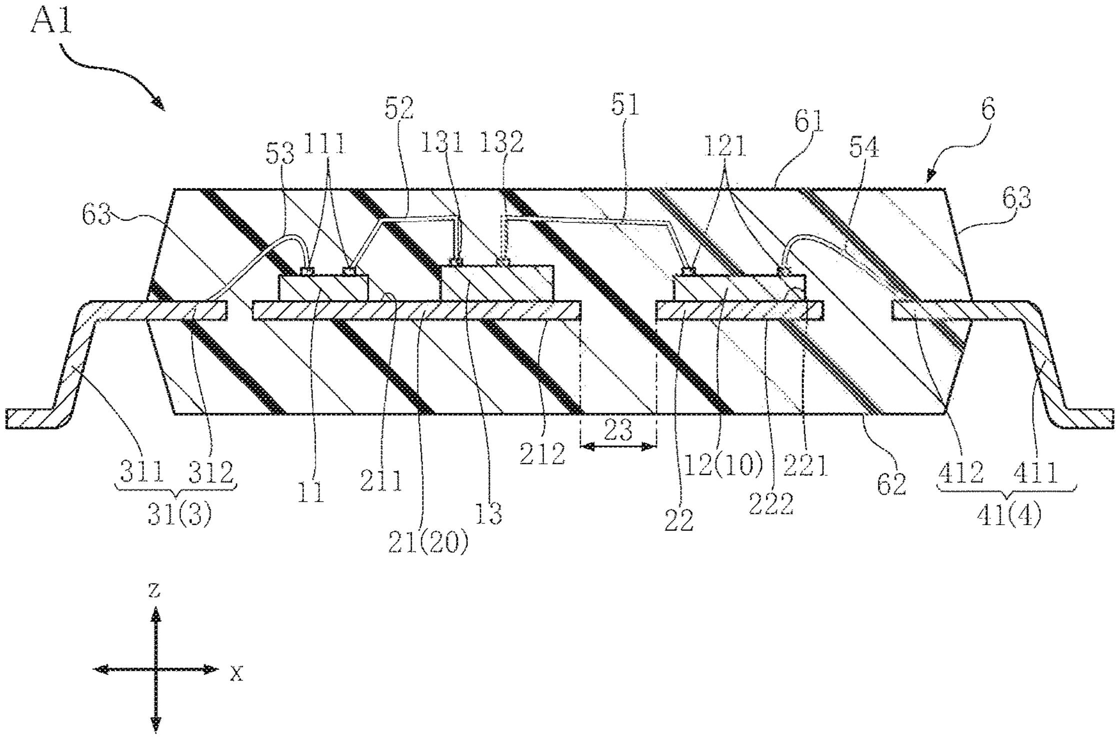
FIG. 6 is a cross-sectional view taken along line VI-VI in FIG. 2.

As shown in FIGS. 2 and 6, a plurality of electrodes 111 are provided on the upper surface of the first semiconductor element 11 (i.e., the surface facing in the same direction as a first obverse surface 211 of the first die pad 21 described below). The electrodes 111 are electrically connected to a circuit configured on the first semiconductor element 11. Similarly, a plurality of electrodes 121 are provided on the upper surface of the second semiconductor element 12 (i.e., the surface facing in the same direction as the first obverse surface 211). The electrodes 121 are electrically connected to a circuit configured on the second semiconductor element 12. A plurality of first electrodes 131 and a plurality of second electrodes 132 are provided on the upper surface of the insulating element 13 (i.e., the surface facing in the same direction as the first obverse surface 211). Each of the first electrodes 131 and the second electrodes 132 is electrically connected to either the transmission inductor or the reception inductor.

Figure 12:
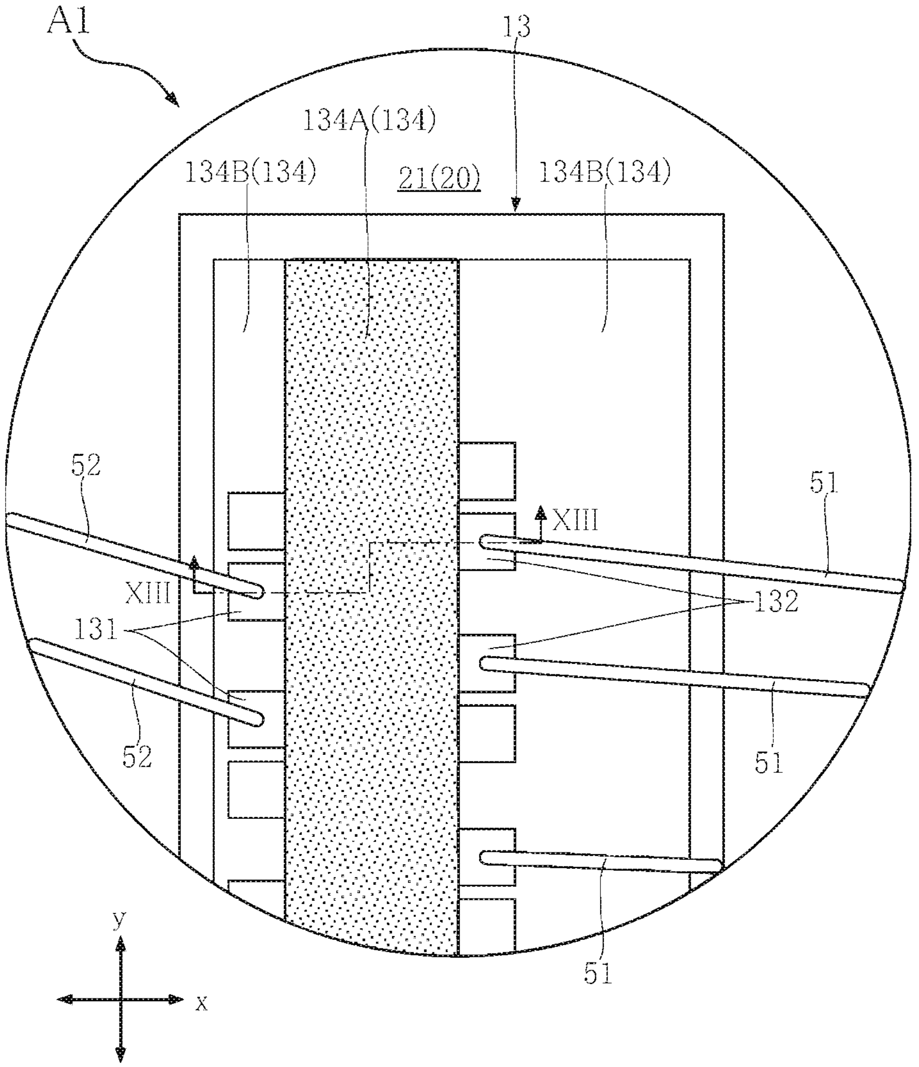
FIG. 12 is a partially enlarged view of FIG. 2.
Figure 13:
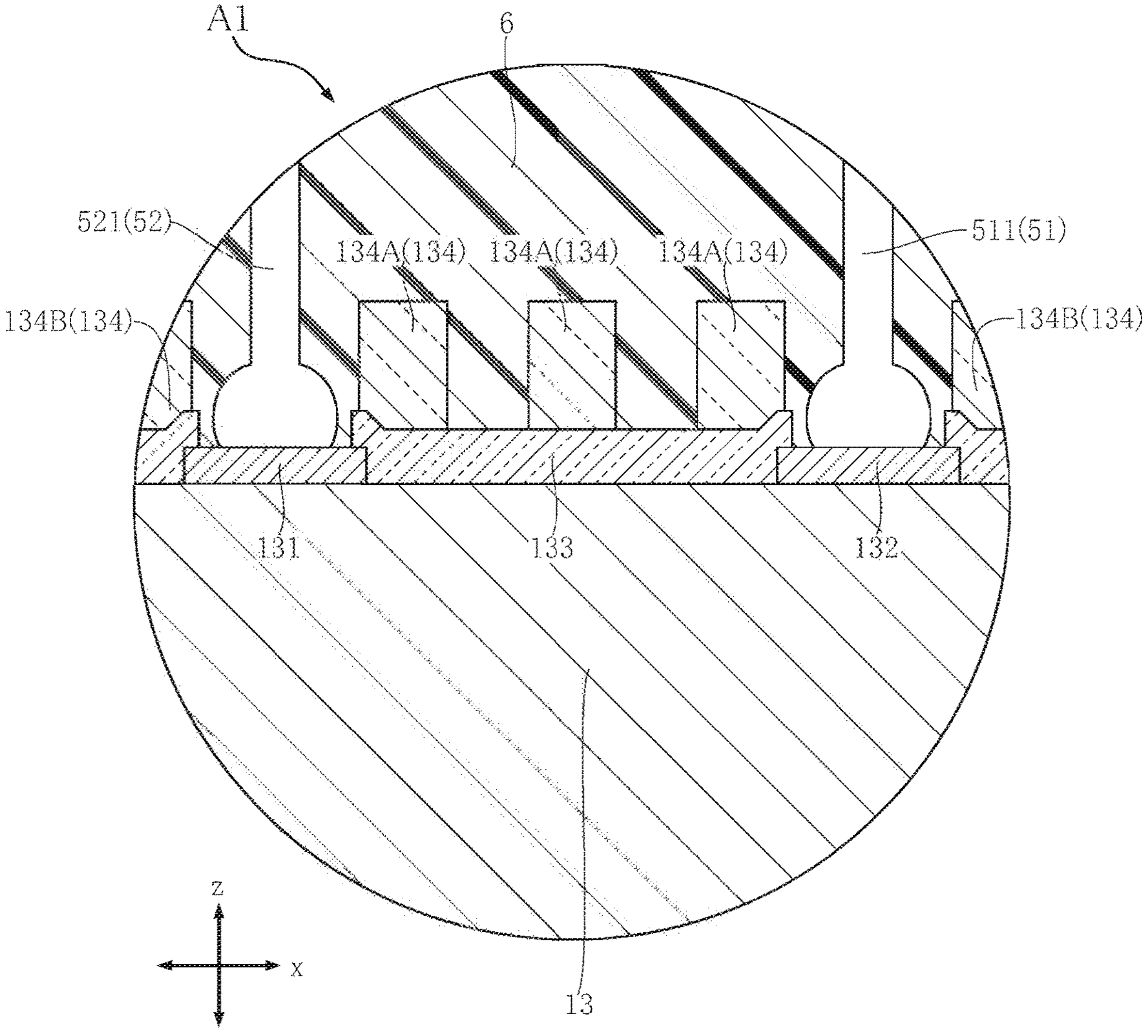
FIG. 13 is a cross-sectional view taken along line XIII-XIII in FIG. 12.

As shown in FIG. 12, the first electrodes 131 are aligned along the second direction y on the insulating element 13. Similarly, the second electrodes 132 are also aligned along the second direction y. As shown in FIG. 13, the insulating element 13 has a passivation film 133 and a surface protection film 134. The passivation film 133 and the surface protection film 134 are both electrically insulative. The passivation film 133 is located at one end of the insulating element 13 in the thickness direction z. For example, the passivation film 133 is made up of a silicon dioxide ($SiO_2$) film and a silicon nitride ($Si_3N_4$) film formed on the silicon dioxide film. The passivation film 133 is in contact with the first electrodes 131 and the second electrodes 132. The surface protection film 134 is formed on the passivation film 133. The surface protection film 134 is made up of a material containing polyimide, for example. The first electrodes 131 and the second electrodes 132 are each exposed from the surface protection film 134. The surface protection film 134 includes a first film 134A and a second film 134B. The first film 134A is located between the first electrodes 131 and the second electrodes 132 in the first direction x. The second film 134B is the portion of the surface protection film 134 excluding the first film 134A. The first film 134A is formed with a plurality of slits penetrating through in the thickness direction z and extending along the second direction y. The slits can increase the creepage distance between one of the first electrodes 131 to one of the second electrodes 132 (i.e., the shortest distance along the surface of each of the passivation film 133 and the first film 134A). This contributes to the improvement of the dielectric strength of the insulating element 13.

The first die pad 21, the second die pad 22, the first terminals 3, and the second terminals 4 are conductive members that form a conductive path between the wiring board of an inverter and each of the first semiconductor element 11, the second semiconductor element 12, and the insulating element 13. These conductive members are made of an alloy containing Cu in its composition, for example. As shown in FIG. 2, the first die pad 21 is arranged on one side in the first direction x. The second die pad 22 is arranged on the other side in the first direction x relative to the first die pad 21, and is spaced apart from the first die pad 21 in the first direction x. Accordingly, a pad gap 23 is formed between the first die pad 21 and the second die pad 22 in the first direction x. As viewed in the thickness direction z, the pad gap 23 extends along the second direction y.

Figure 7:
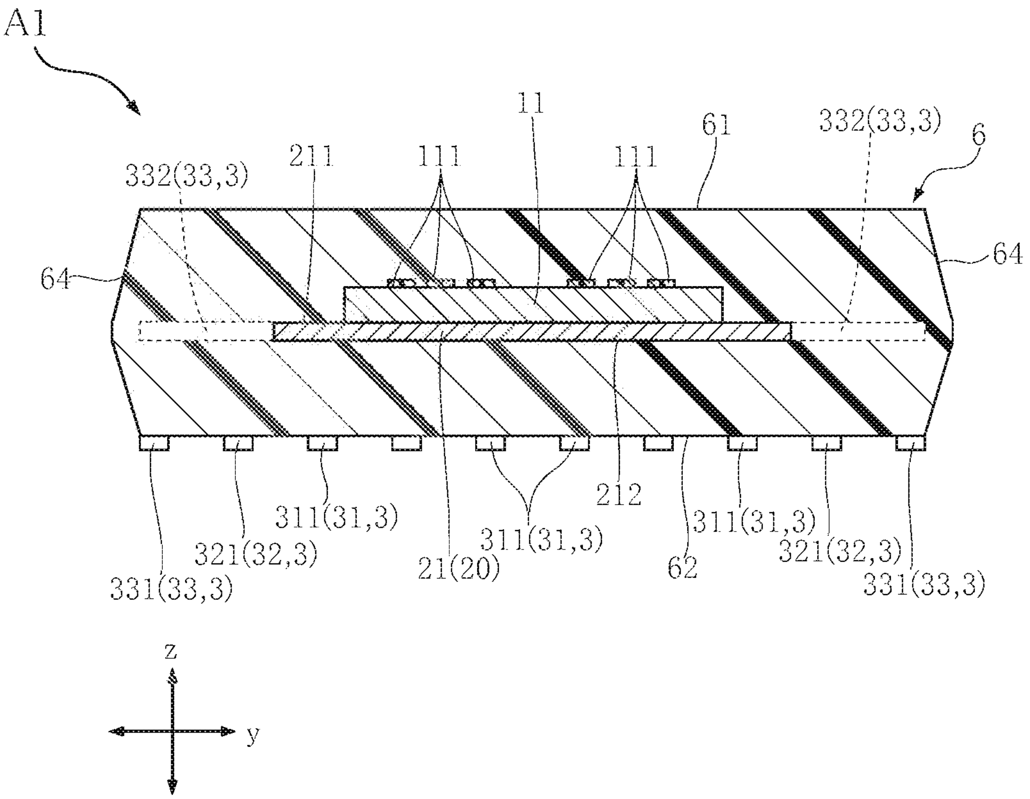
FIG. 7 is a cross-sectional view taken along line VII-VII in FIG. 2.

As shown in FIGS. 2 and 6, the first semiconductor element 11 and the insulating element 13 are mounted on the first die pad 21. The first die pad 21 is electrically connected to the first semiconductor element 11. The first die pad 21 is a constituent element of the first circuit described above. The first die pad 21 has a substantially rectangular shape as viewed in the thickness direction z. The first die pad 21 has a thickness (i.e., dimension or size in the thickness direction z) of about 100 μm to 300 μm, for example. As shown in FIGS. 6 and 7, the first die pad 21 has a first obverse surface 211 and a first reverse surface 212. The first obverse surface 211 and the first reverse surface 212 are spaced apart from each other in the thickness direction z. The first obverse surface 211 and the first reverse surface 212 face away from each other in the thickness direction z. Each of the first obverse surface 211 and the first reverse surface 212 is flat (or substantially flat). The first semiconductor element 11 and the insulating element 13 are bonded to the first obverse surface 211 via a non-illustrated conductive bonding member (e.g., solder, metal paste, or sintered metal).

As shown in FIGS. 2 and 6, the second semiconductor element 12 is mounted on the second die pad 22. The second die pad 22 is electrically connected to the second semiconductor element 12. The second die pad 22 is a constituent element of the second circuit described above. As such, the second die pad 22 has a different potential from the first die pad 21. The second die pad 22 has a substantially rectangular shape as viewed in the thickness direction z. The first die pad 21 and the second die pad 22 are spaced apart from each other and aligned in the first direction x. The second die pad 22 overlaps with the first die pad 21 as viewed in the first direction x. The first die pad 21 and the second die pad 22 are galvanically isolated from each other. The second die pad 22 has a thickness (i.e., dimension in the thickness direction z) of about 100 μm to 300 μm, for example. As shown in FIG. 6, the second die pad 22 has a second obverse surface 221 and a second reverse surface 222. The second obverse surface 221 and the second reverse surface 222 are spaced apart from each other in the thickness direction z. The second obverse surface 221 and the second reverse surface 222 face away from each other in the thickness direction z. Each of the second obverse surface 221 and the second reverse surface 222 is flat (or substantially flat). The thickness of each of the first die pad 21 and the second die pad 22 ranges from 0.2 to 1.2 times the length of the pad gap 23. The second semiconductor element 12 is bonded to the second obverse surface 221 via a non-illustrated conductive bonding member (e.g., solder, metal paste, or sintered metal).

Figure 2:
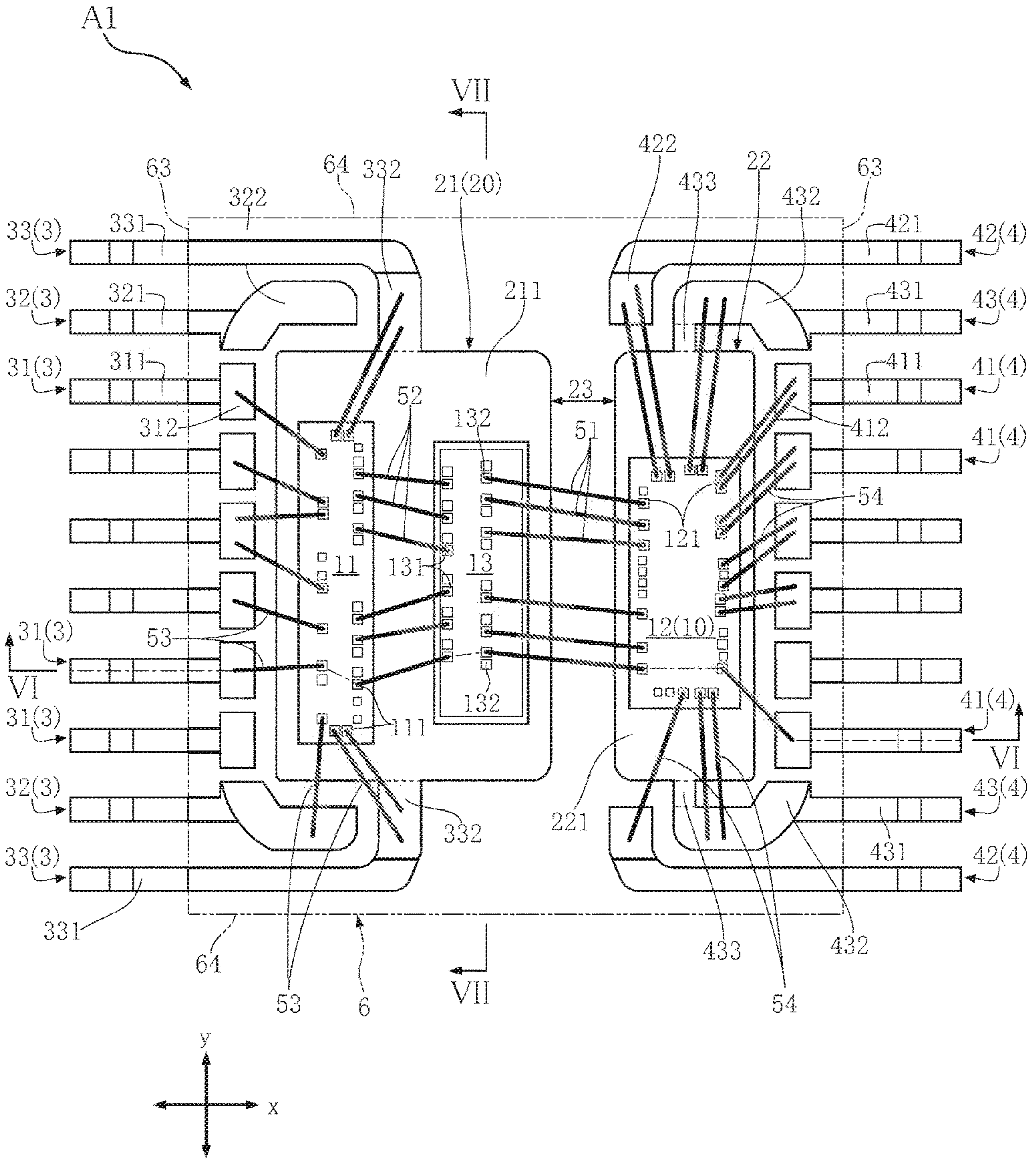
FIG. 2 is a plan view corresponding to FIG. 1, as seen through a sealing resin.
Figure 4:
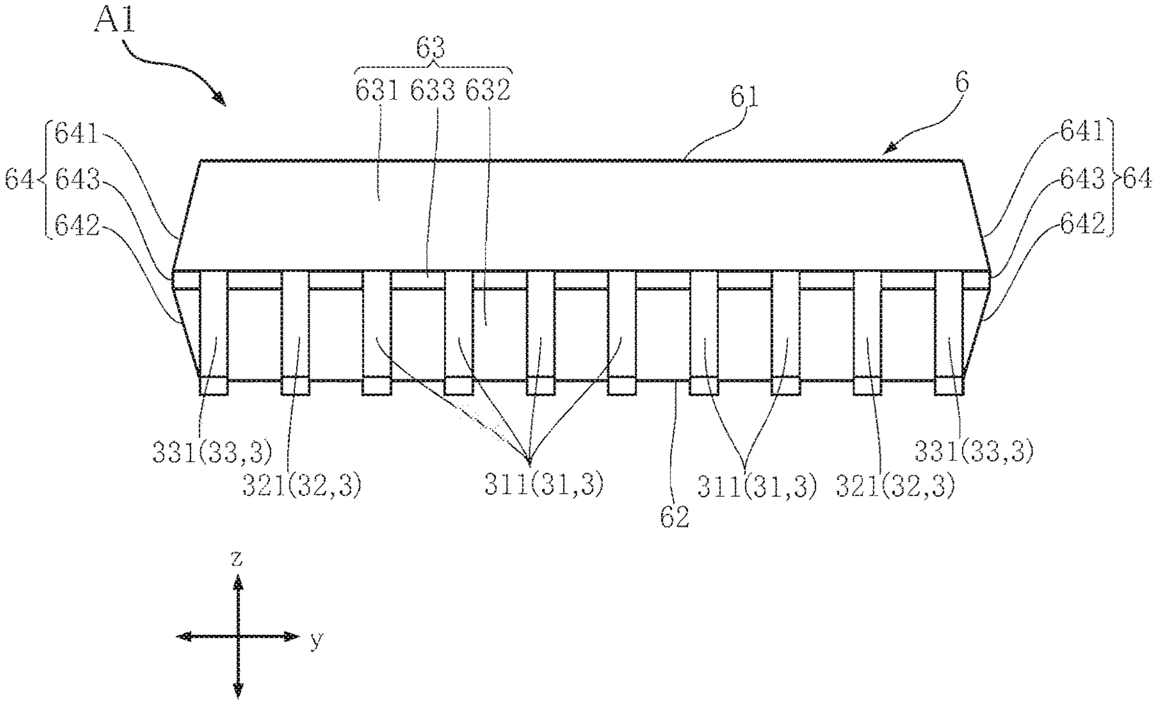
FIG. 4 is a left-side view illustrating the semiconductor device of FIG. 1.

As shown in FIGS. 1 and 2, the first terminals 3 include portions located on one side in the first direction x relative to the first die pad 21. The first terminals 3 are aligned along the second direction y. At least one of the first terminals 3 is electrically connected to the first circuit described above. As shown in FIGS. 1 and 4, the first terminals 3 are exposed from a first side surface 63 of the sealing resin 6, which is one of a pair of first side surfaces 63 described below and located on one side in the first direction x. The first terminals 3 include a plurality of first intermediate terminals 31, a pair of first side terminals 32, and a pair of first support terminals 33.

As shown in FIGS. 2 and 4, the first intermediate terminals 31 are flanked by the pair of first side terminals 32 in the second direction y. Each of the first intermediate terminals 31 has a lead section 311 and a pad section 312.

Figure 3:
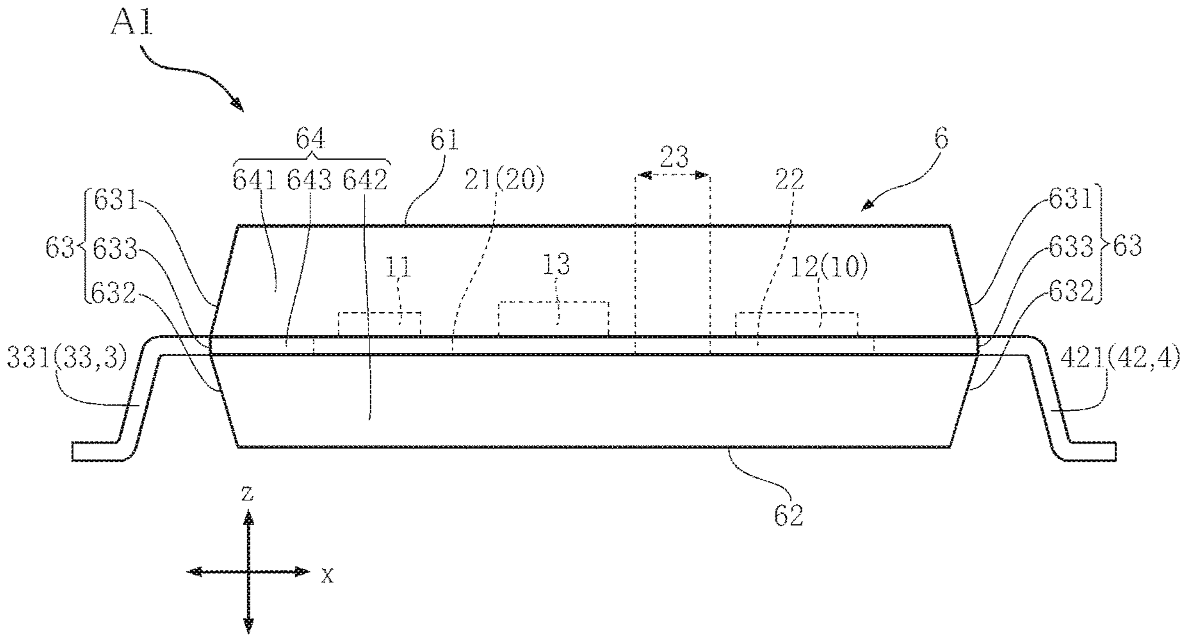
FIG. 3 is a front view illustrating the semiconductor device of FIG. 1.

As shown in FIG. 2, the lead section 311 has a band shape extending along the first direction x, as viewed in the thickness direction z. As viewed in the thickness direction z, the lead section 311 has a portion protruding from the sealing resin 6 along the first direction x, and a portion covered with the sealing resin 6. As shown in FIG. 3, the portion of the lead section 311 that protrudes from the sealing resin 6 is bent into a gull-wing shape. The portion of the lead section 311 that is exposed from the sealing resin 6 may be subjected to a plating process. A plating layer formed by the plating process is made of an alloy containing Sn, such as solder, and covers the portion exposed from the sealing resin 6. When the semiconductor device A1 is surface-mounted on the wiring board of an inverter by solder bonding, the plating layer facilitates adhesion of solder to the exposed portion and prevents erosion of the exposed portion caused by solder bonding.

As shown in FIG. 2, the pad section 312 is connected to the lead section 311 and covered with the sealing resin 6. The pad section 312 is larger in dimension than the lead section 311 in the second direction y. The upper surface of the pad section 312 (i.e., the surface facing in the same direction as the first obverse surface 211 of the first die pad 21) may be subjected to a plating process. A plating layer formed by the plating process is made of a metal layer containing Ag, for example. The plating layer increases the bonding strength of one of the third wires 53 described below to the pad section 312, and protects the pad section 312 from an impact caused by the bonding of the third wire 53. The pad section 312 is flat (or approximately flat).

As shown in FIGS. 2 and 4, the pair of first side terminals 32 are arranged on the opposite sides of the entirety of the first intermediate terminals 31 in the second direction y. Each of the pair of first side terminals 32 has a lead section 321 and a pad section 322.

As shown in FIG. 2, the lead section 321 has a band shape extending along the first direction x, as viewed in the thickness direction z. As viewed in the thickness direction z, the lead section 321 has a portion protruding from the sealing resin 6 along the first direction x, and a portion covered with the sealing resin 6. As shown in FIG. 3, the portion of the lead section 321 protruding from the sealing resin 6 is bent into a gull-wing shape. As with the lead section 311, the portion of the lead section 321 that is exposed from the sealing resin 6 may be covered with a plating layer (e.g., an alloy containing Sn such as solder).

As shown in FIG. 2, the pad section 322 is connected to the lead section 321 and covered with the sealing resin 6. The pad section 322 is larger in dimension than the lead section 321 in the second direction y. As with the upper surface of the pad section 312, the upper surface of the pad section 322 (i.e., the surface facing in the same direction as the first obverse surface 211 of the first die pad 21) may be covered with a plating layer (e.g., a metal containing Ag). The pad section 322 is flat (or approximately flat).

As shown in FIGS. 2 and 4, the pair of first support terminals 33 are spaced apart from each other in the second direction y. The pair of first support terminals 33 are connected to the opposite ends of the first die pad 21 in the second direction y. In this way, the first die pad 21 is supported by the pair of first support terminals 33. In the semiconductor device A1, the pair of first support terminals 33 are arranged on the opposite sides of the entirety of the pair of first side terminals 32 in the second direction y. Each of the pair of first support terminals 33 has a lead section 331 and a pad section 332.

As shown in FIG. 2, the lead section 331 has a band shape extending along the first direction x, as viewed in the thickness direction z. As viewed in the thickness direction z, the lead section 331 has a portion protruding from the sealing resin 6 along the first direction x, and a portion covered with the sealing resin 6. As shown in FIG. 3, the portion of the lead section 331 that protrudes from the sealing resin 6 is bent into a gull-wing shape. As with the lead section 311, the portion of the lead section 331 that is exposed from the sealing resin 6 may be covered with a plating layer (e.g., an alloy containing Sn such as solder). The portion of the lead section 331 that is covered with the sealing resin 6 is longer than the portion of each of the lead section 311 and the lead section 321 that is covered with the sealing resin 6.

As shown in FIG. 2, the pad section 332 is connected to the lead section 331 and covered with the sealing resin 6. An end of the pad section 332 is connected to the first die pad 21. As with the upper surface of the pad section 312, the upper surface of the pad section 332 (i.e., the surface facing in the same direction as the first obverse surface 211 of the first die pad 21) may be covered with a plating layer (e.g., a metal layer containing Ag). The pad section 332 is flat (or approximately flat).

Figure 5:
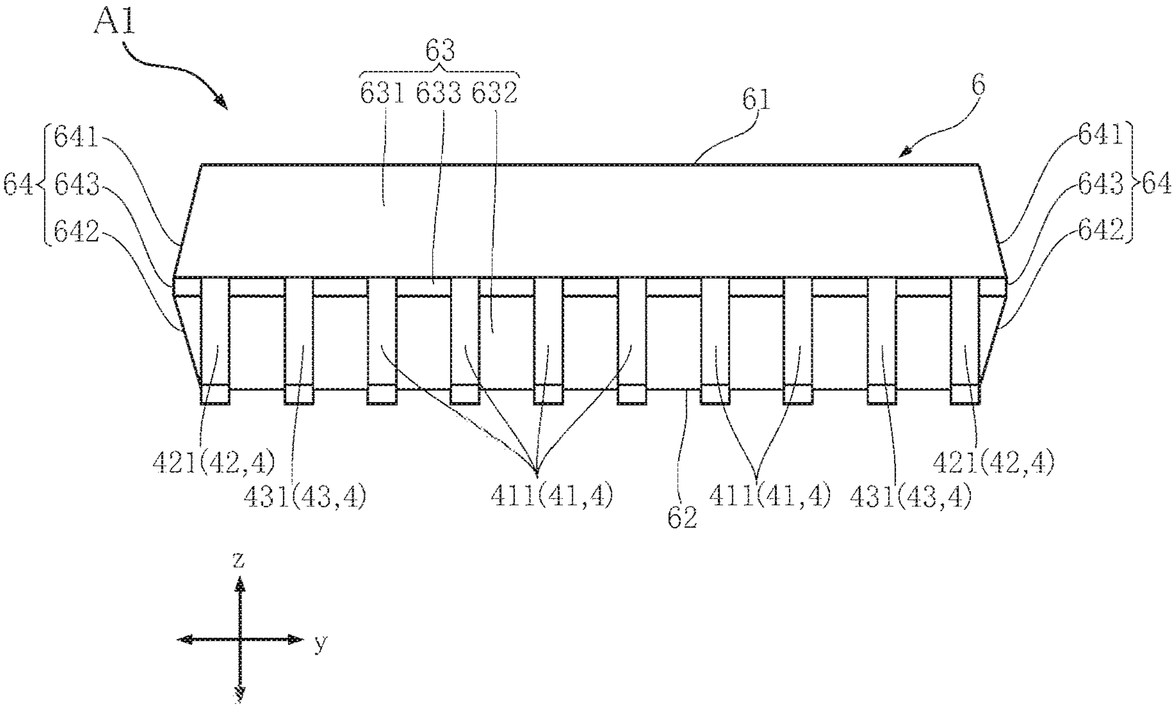
FIG. 5 is a right-side view illustrating the semiconductor device of FIG. 1.

As shown in FIGS. 1 and 2, the second terminals 4 include portions located on the other side in the first direction x relative to the second die pad 22. The second terminals 4 are aligned along the second direction y. At least one of the second terminals 4 is electrically connected to the second circuit described above. As shown in FIGS. 1 and 5, the second terminals 4 are exposed from a first side surface 63 of the sealing resin 6, which is one of the pair of first side surfaces 63 described below and located on the other side in the first direction x. The second terminals 4 include a plurality of second intermediate terminals 41, a pair of second side terminals 42, and a pair of second support terminals 43.

As shown in FIGS. 2 and 5, the second intermediate terminals 41 are flanked by the pair of second support terminals 43 in the second direction y. Each of the second intermediate terminals 41 has a lead section 411 and a pad section 412.

As shown in FIG. 2, the lead section 411 has a band shape extending along the first direction x, as viewed in the thickness direction z. As viewed in the thickness direction z, the lead section 411 has a portion protruding from the sealing resin 6 along the first direction x, and a portion covered with the sealing resin 6. As shown in FIG. 3, the portion of the lead section 411 that protrudes from the sealing resin 6 is bent into a gull-wing shape. As with the lead section 311, the portion of the lead section 411 that is exposed from the sealing resin 6 may be covered with a plating layer (e.g., an alloy containing Sn such as solder).

As shown in FIG. 2, the pad section 412 is connected to the lead section 411 and covered with the sealing resin 6. The pad section 412 is larger in dimension than the lead section 411 in the second direction y. The upper surface of the pad section 412 (i.e., the surface facing in the same direction as the first obverse surface 211 of the first die pad 21) may be subjected to a plating process. A plating layer formed by the plating process is made of a metal layer containing Ag, for example. The plating layer increases the bonding strength of one of the fourth wires 54 described below to the pad section 412, and protects the pad section 412 from an impact caused by the bonding of the fourth wire 54. The pad section 412 is flat (or approximately flat).

As shown in FIGS. 2 and 5, the pair of second side terminals 42 are arranged on the opposite sides of the entirety of the second intermediate terminals 41 in the second direction y. Each of the pair of second side terminals 42 has a lead section 421 and a pad section 422.

As shown in FIG. 2, the lead section 421 has a band shape extending along the first direction x, as viewed in the thickness direction z. As viewed in the thickness direction z, the lead section 421 has a portion protruding from the sealing resin 6 along the first direction x, and a portion covered with the sealing resin 6. As shown in FIG. 3, the portion of the lead section 421 that protrudes from the sealing resin 6 is bent into a gull-wing shape. As with the lead section 311, the portion of the lead section 421 that is exposed from the sealing resin 6 may be covered with a plating layer (e.g., an alloy containing Sn such as solder). The portion of the lead section 421 that is covered with the sealing resin 6 is longer than the portion of the lead section 411 that is covered with the sealing resin 6.

As shown in FIG. 2, the pad section 422 is connected to the lead section 421 and covered with the sealing resin 6. The pad section 422 is larger in dimension than the lead section 421 in the second direction y. As with the upper surface of the pad section 312, the upper surface of the pad section 422 (i.e., the surface facing in the same direction as the first obverse surface 211 of the first die pad 21) may be covered with a plating layer (e.g., a metal layer containing Ag). The pad section 422 is flat (or approximately flat).

As shown in FIGS. 2 and 5, the pair of second support terminals 43 are spaced apart from each other in the second direction y. The pair of second support terminals 43 are connected to the opposite ends of the second die pad 22 in the second direction y. In this way, the second die pad 22 is supported by the pair of second support terminals 43. In the semiconductor device A1, the pair of second support terminals 43 are arranged on the opposite sides of the entirety of the second intermediate terminals 41 in the second direction y, and are flanked by the pair of second side terminals 42 in the second direction y. Each of the pair of second support terminals 43 has a lead section 431, a pad section 433, and a connecting section 433.

As shown in FIG. 2, the lead section 431 has a band shape extending along the first direction x, as viewed in the thickness direction z. As viewed in the thickness direction z, the lead section 431 has a portion protruding from the sealing resin 6 along the first direction x, and a portion covered with the sealing resin 6. As shown in FIG. 3, the portion of the lead section 431 that protrudes from the sealing resin 6 is bent into a gull-wing shape. As with the lead section 311, the portion of the lead section 431 that is exposed from the sealing resin 6 may be covered with a plating layer (e.g., an alloy containing Sn such as solder).

As shown in FIG. 2, the pad section 432 is connected to the lead section 431 and covered with the sealing resin 6. The pad section 432 is larger in dimension than the lead section 431 in the second direction y. The pad section 432 extends in the first direction x. As with the upper surface of the pad section 312, the upper surface of the pad section 432 (i.e., the surface facing in the same direction as the first obverse surface 211 of the first die pad 21) may be covered with a plating layer (e.g., a metal layer containing Ag). The pad section 432 is flat (or approximately flat).

As shown in FIG. 2, the connecting section 433 is connected to the pad section 432 and covered with the sealing resin 6. The connecting section 433 extends in the second direction y. An end of the connecting section 433 is connected to the second die pad 22. As with the upper surface of the pad section 312, the upper surface of the connecting section 433 (i.e., the surface facing in the same direction as the first obverse surface 211 of the first die pad 21) may be covered with a plating layer (e.g., a metal layer containing Ag).

The first wires 51, the second wires 52, the third wires 53, and the fourth wires 54 connect the first die pad 21, the second die pad 22, the first terminals 3, and the second terminals 4 to together form a conductive path for the first semiconductor element 11, the second semiconductor element 12, and the insulating element 13 to perform predetermined functions. The first wires 51, the second wires 52, the third wires 53, and the fourth wires 54 are each made of a metal such as Au, Cu, or A1.

As shown in FIGS. 2 and 6, the first wires 51 are bonded to the insulating element 13 and the specific semiconductor element 10 (the second semiconductor element 12 in the semiconductor device A1). The first wires 51 electrically connect the insulating element 13 and the specific semiconductor element 10. In the semiconductor device A1, each of the first wires 51 is bonded to one of the second electrodes 132 of the insulating element 13 and one of the electrodes 121 of the second semiconductor element 12. The first wires 51 are aligned along the second direction y. Each of the first wires 51 bridges across the pad gap 23.

Figure 8:
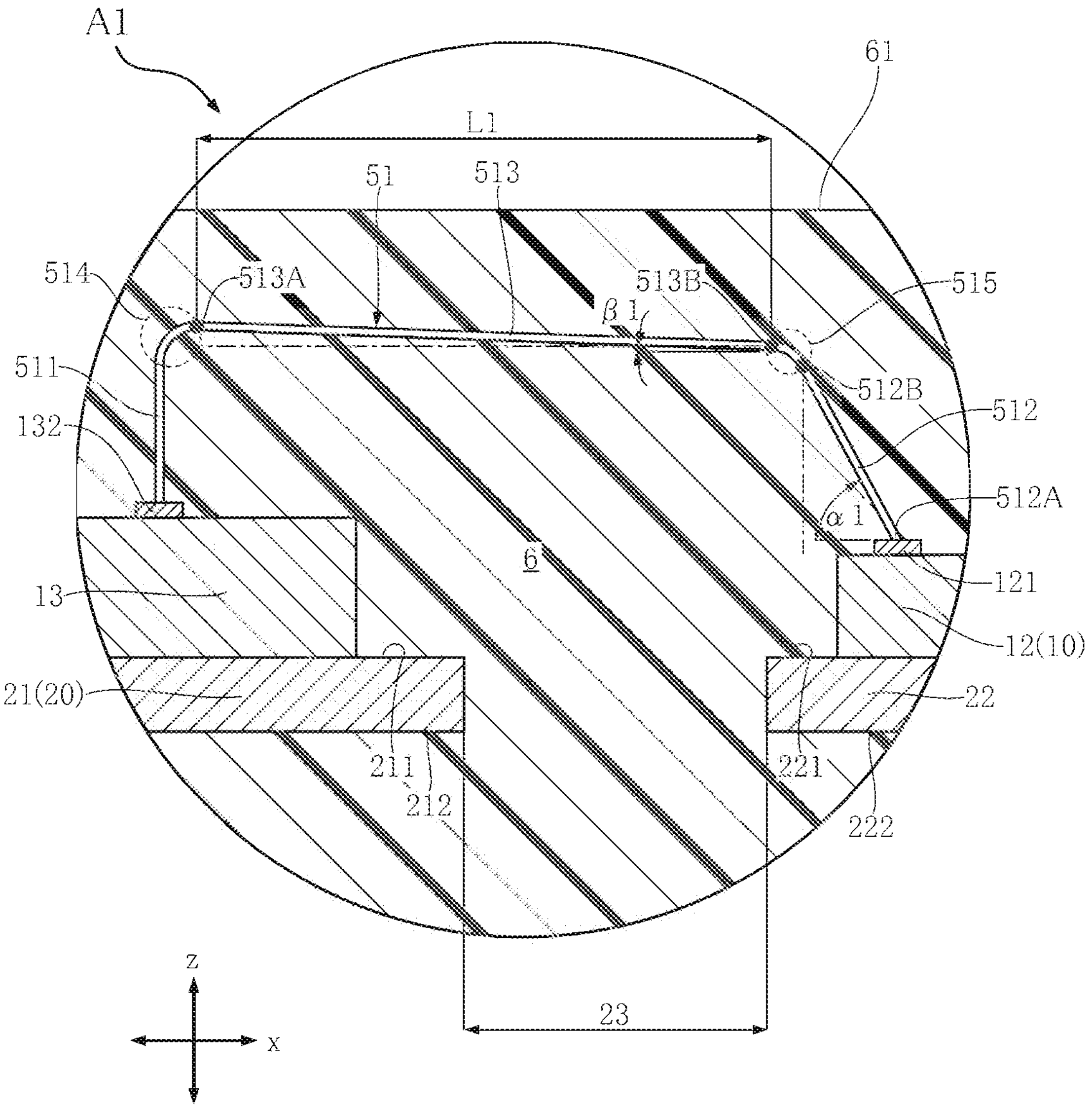
FIG. 8 is a partially enlarged view of FIG. 6.

As shown in FIG. 8, each of the first wires 51 has a first upright section 511, a first inclined section 512, a first extended section 513, a first bent section 514, and a second bent section 515. The first upright section 511 rises from one of the second electrodes 132 of the insulating element 13 in the thickness direction z. The first inclined section 512 is inclined relative to the thickness direction z and extends from one of the electrodes 121 of the second semiconductor element 12 toward the insulating element 13. As viewed in the thickness direction z, the first extended section 513 is located between the first upright section 511 and the first inclined section 512. The first bent section 514 is connected to the first upright section 511 and the first extended section 513. The second bent section 515 is connected to the first inclined section 512 and the first extended section 513.

As shown in FIG. 8, the first extended section 513 of each of the first wires 51 bridges across the pad gap 23. In each of the first wires 51, an inclination angle β1 of the first extended section 513 relative to a plane along the first direction x and the second direction y is smaller than an inclination angle α1 of the first inclined section 512 relative to the said plane. As such, each of the first wires 51 forms a trapezoidal shape as viewed in a direction perpendicular to the thickness direction z. It is preferable that the inclination angle β1 of the first extended section 513 be 0° (or substantially 0°).

As shown in FIG. 8, a boundary 513A between the first extended section 513 and the first bent section 514 is farther away from the insulating element 13 than a boundary 513B between the first extended section 513 and the second bent section 515 in the thickness direction z. Furthermore, as viewed in the thickness direction z, a boundary 512B between the first inclined section 512 and the second bent section 515 is located away from the specific semiconductor element 10.

Figure 9:
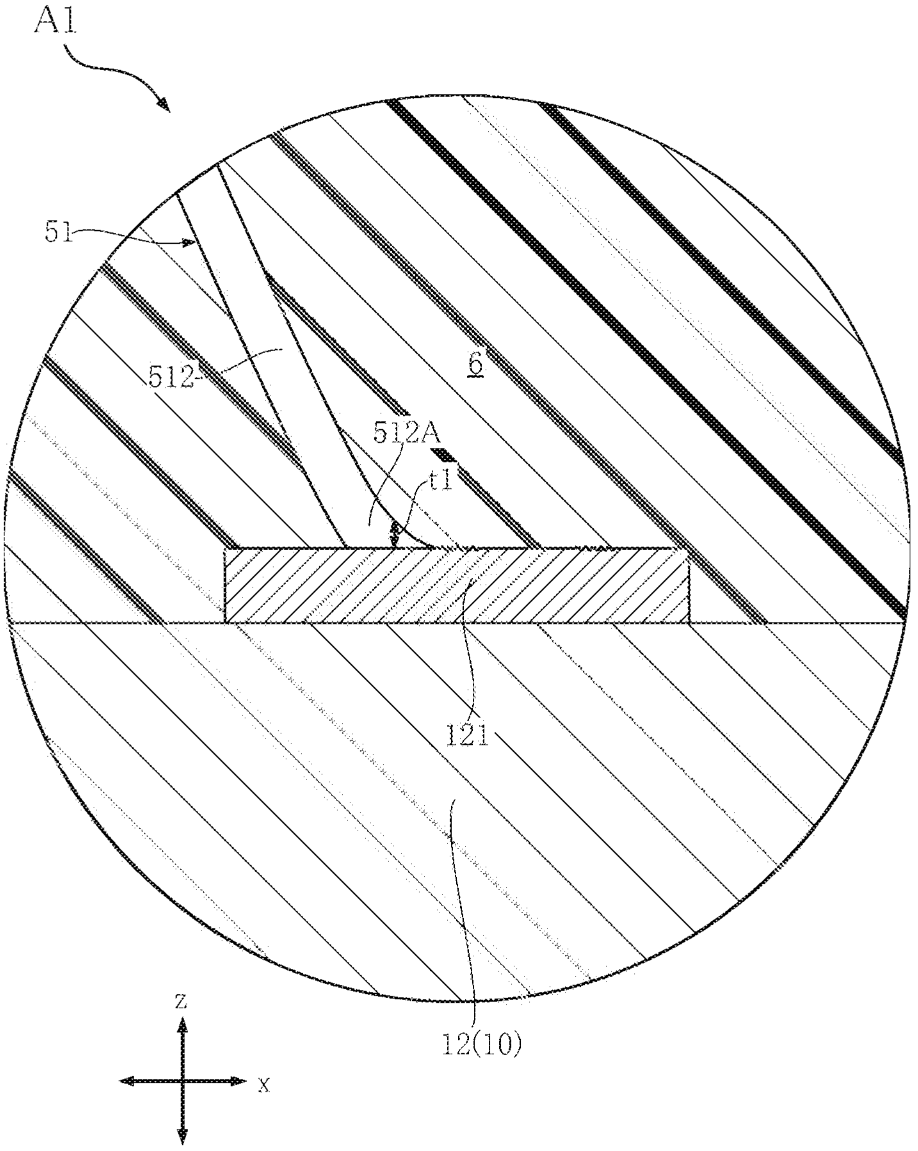
FIG. 9 is a partially enlarged view of FIG. 9.

As shown in FIG. 9, the first inclined section 512 of each of the first wires 51 has a first tip 512A bonded to the specific semiconductor element 10 (one of the electrodes 121 of the second semiconductor element 12 in the semiconductor device A1). A dimension t1 of the first tip 512A in the thickness direction z decreases gradually with distance from the first extended section 513 of the first wire 51.

As shown in FIGS. 2 and 6, the second wires 52 are bonded to the insulating element 13 and the semiconductor element (the first semiconductor element 11 in the semiconductor device A1) which is one of the first semiconductor element 11 and the second semiconductor element 12 and which is mounted on the specific die pad 20 (the first die pad 21 in the semiconductor device A1). The second wires 52 electrically connect the insulating element 13 and the semiconductor element mounted on the specific die pad 20. In the semiconductor device A1, each of the second wires 52 is bonded to one of the first electrodes 131 of the insulating element 13 and one of the electrodes 111 of the first semiconductor element 11. The second wires 52 are aligned along the second direction y. As viewed in the thickness direction z, the second wires 52 overlap with the specific die pad 20.

As shown in FIG. 10, each of the second wires 52 has a second upright section 521, a second inclined section 522, a second extended section 523, a third bent section 524, and a fourth bent section 525. The second upright section 521 rises from one of the first electrodes 131 of the insulating element 13 in the thickness direction z. The second inclined section 522 is inclined relative to the thickness direction z and extends from one of the electrodes 111 of the first semiconductor element 11 toward the insulating element 13. As viewed in the thickness direction z, the second extended section 523 is located between the second upright section 521 and the second inclined section 522. The third bent section 524 is connected to the second upright section 521 and the second extended section 523. The fourth bent section 525 is connected to the second inclined section 522 and the second extended section 523.

As shown in FIG. 10, a length L2 of the second extended section 523 of each of the second wires 52 is smaller than a length L1 (see FIG. 8) of the first extended section 513 of each of the first wires 51 shown in FIG. 8. The length L2 of the second extended section 523 corresponds to the distance from a boundary 523A between the second extended section 523 and the third bent section 524 to a boundary 523B between the second extended section 523 and the fourth bent section 525. The length L1 of the first extended section 513 corresponds to the distance from the boundary 513A between the first extended section 513 and the first bent section 514 to the boundary 513B between the first extended section 513 and the second bent section 515. In each of the second wires 52, an inclination angle β2 of the second extended section 523 relative to a plane along the first direction x and the second direction y is smaller than an inclination angle α2 of the second inclined section 522 relative to the said plane. As such, each of the second wires 52 forms a trapezoidal shape as viewed in a direction perpendicular to the thickness direction z. It is preferable that the inclination angle β2 of the second extended section 523 be 0° (or substantially 0°). Furthermore, as viewed in the thickness direction z, a boundary 522B between the second inclined section 522 and the fourth bent section 525 is located away from the semiconductor element mounted on the specific die pad 20.

Figure 11:
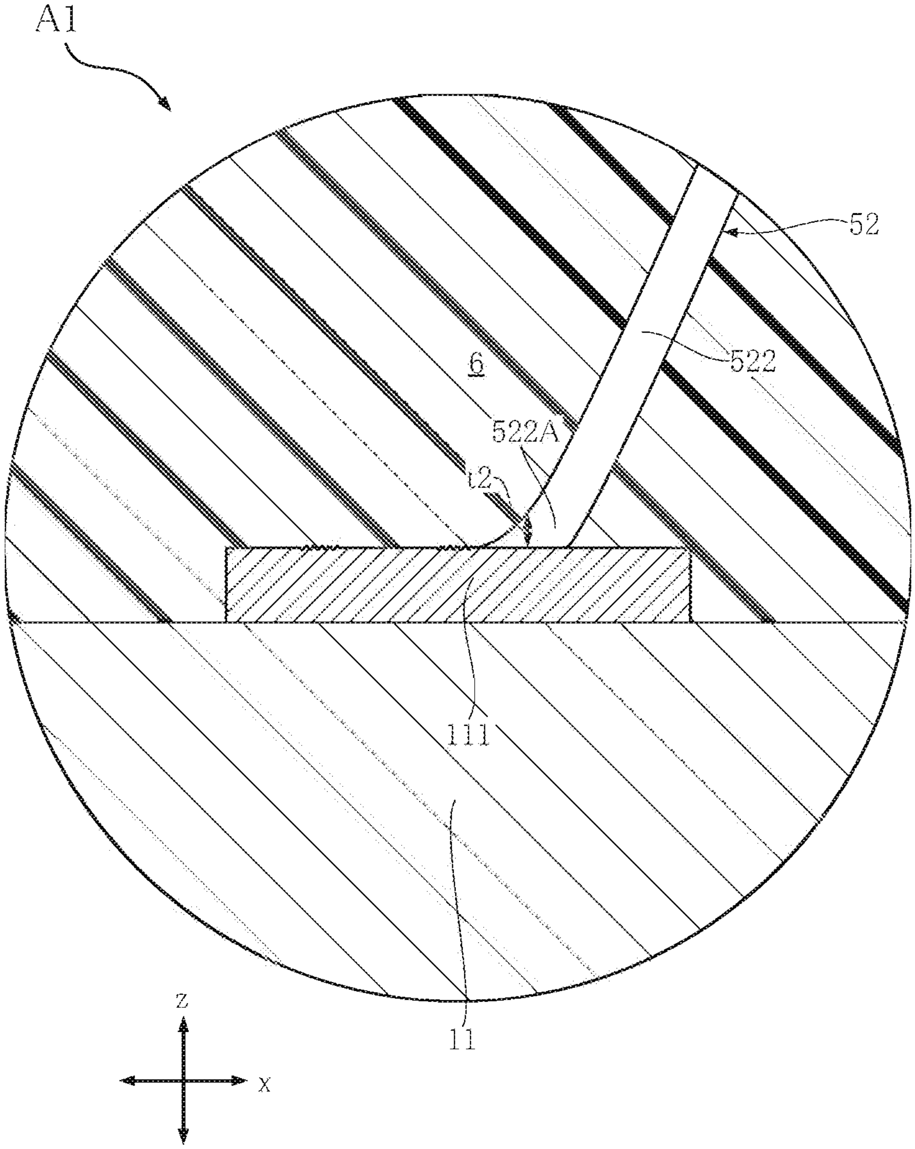
FIG. 11 is a partially enlarged view of FIG. 10.

As shown in FIG. 11, the second inclined section 522 of each of the second wires 52 has a second tip 522A bonded to the semiconductor element (one of the electrodes 111 of the first semiconductor element 11 in the semiconductor device A1) mounted on the specific die pad 20. A dimension t2 of the second tip 522A in the thickness direction z decreases gradually with distance from the second extended section 523 of the second wire 52.

Figure 14:
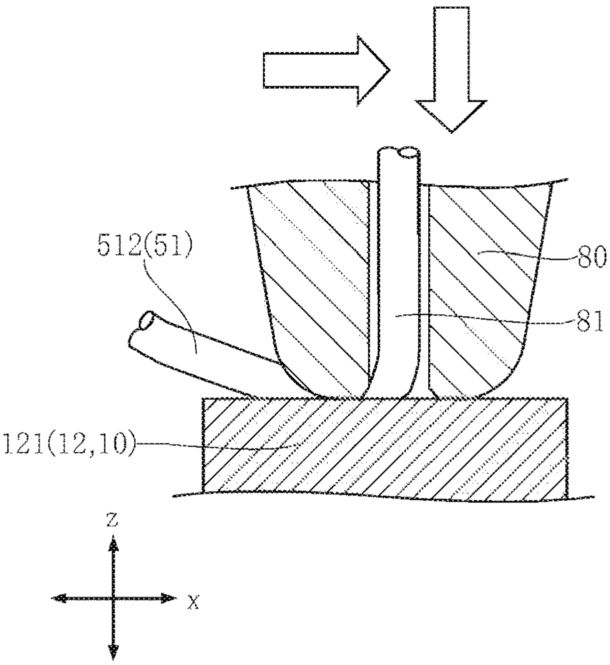
FIG. 14 is a cross-sectional view illustrating a manufacturing step of the semiconductor device of FIG. 1.
Figure 15:
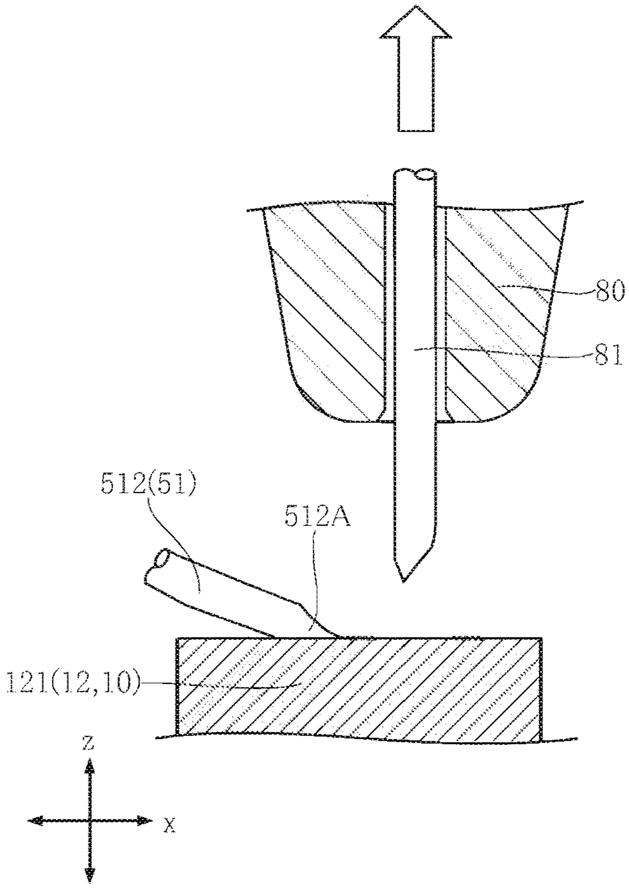
FIG. 15 is a cross-sectional view illustrating a manufacturing step of the semiconductor device of FIG. 1.

The shape of the first tip 512A of the first inclined section 512 of each of the first wires 51 shown in FIG. 9 is obtained by the method for forming the first wires 51 shown in FIGS. 14 and 15. As shown in FIG. 14, a capillary 80 is moved to a position directly above one of the electrodes 121 of the second semiconductor element 12 (i.e., the specific semiconductor element 10), and the capillary 80 is then lowered to press the tip of the capillary 80 against the electrode 121. Next, as shown in FIG. 15, the capillary 80 is raised to cut a wire 81. The shape of the first tip 512A is obtained through the forming method described above.

Figure 16:
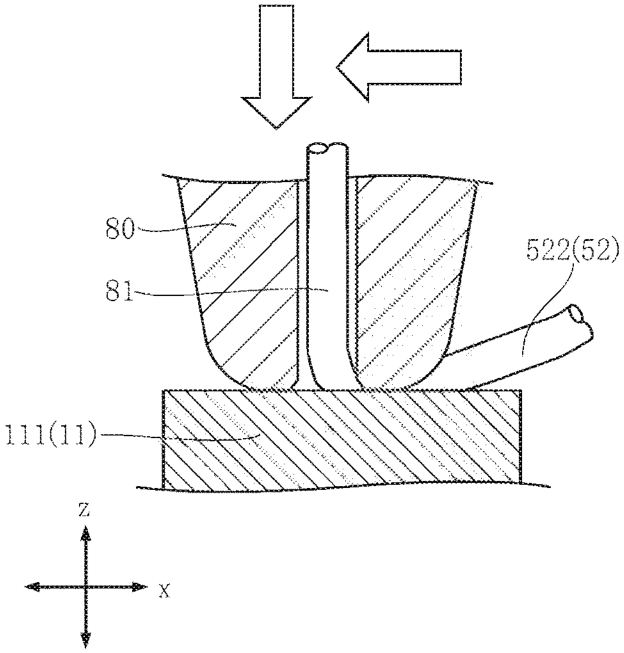
FIG. 16 is a cross-sectional view illustrating a manufacturing step of the semiconductor device of FIG. 1.
Figure 17:
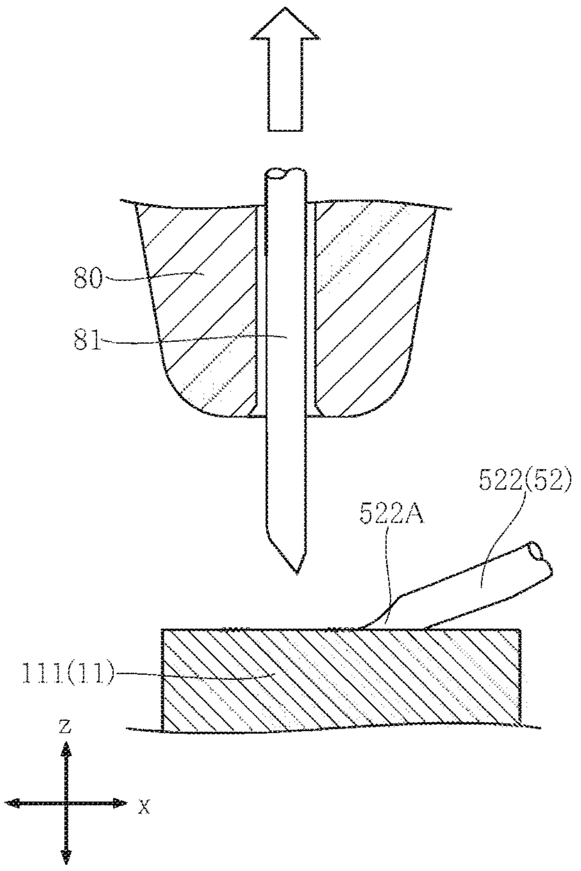
FIG. 17 is a view illustrating a manufacturing step of the semiconductor device of FIG. 1.

The shape of the second tip 522A of the second inclined section 522 of each of the second wires 52 shown in FIG. 11 is obtained by the method for forming the second wires 52 shown in FIGS. 16 and 17. As shown in FIG. 16, the capillary 80 is moved to a position directly above one of the electrodes 111 of the first semiconductor element 11 (i.e., the semiconductor element mounted on the specific die pad 20), and the capillary 80 is then lowered to press the tip of the capillary 80 against the electrode 111. Next, as shown in FIG. 17, the capillary 80 is raised to cut the wire 81. The shape of the second tip 522A is obtained through the forming method described above.

After the first tip 512A of the first inclined section 512 of one of the first wires 51 is formed by the forming method shown in FIGS. 14 and 15, the second tip 522A of the second inclined section 522 of one of the second wires 52 is formed by the forming method shown in FIGS. 16 and 17. Employing the forming method as described above for forming the first wires 51 and the second wires 52 allows uniform adhesion of the residue of the wire 81 along the inner peripheral surface of the capillary 80 at the tip thereof. As a result, the diameters of the first wires 51 and the second wires 52 are made uniform. This contributes to the prevention of disconnection of each of the first wires 51 and the second wires 52.

As shown in FIGS. 2 and 6, each of the third wires 53 is bonded to one of the electrodes 111 of the first semiconductor element 11 and one of the first terminals 3 (i.e., one from among the pad sections 312 of the first intermediate terminals 31, the pad sections 322 of the pair of first side terminals 32, and the pad sections 332 of the pair of first support terminals 33). The third wires 53 electrically connect the first semiconductor element 11 to at least one of the first terminals 3.

As shown in FIGS. 2 and 6, each of the fourth wires 54 is bonded to one of the electrodes 121 of the second semiconductor element 12 and one of the second terminals 4 (i.e., one from among the pad sections 412 of the second intermediate terminals 41, the pad sections 422 of the pair of second side terminals 42, and the pad sections 432 of the pair of second support terminals 43). The fourth wires 54 electrically connect the second semiconductor element 12 and at least one of the second terminals 4.

As shown in FIG. 1, the sealing resin 6 covers the first semiconductor element 11, the second semiconductor element 12, the insulating element 13, the first die pad 21, the second die pad 22, and portions of the first terminals 3 and the second terminals 4. As shown in FIG. 6, the sealing resin 6 further covers the first wires 51, the second wires 52, the third wires 53, and the fourth wires 54. The sealing resin 6 is electrically insulative. The sealing resin 6 insulates the first die pad 21 and the second die pad 22 from each other. The sealing resin 6 is made of a material containing a black epoxy resin, for example. The sealing resin 6 has a rectangular shape as viewed in the thickness direction z.

As shown in FIGS. 3 to 5, the sealing resin 6 has a top surface 61, a bottom surface 62, a pair of first side surfaces 63, and a pair of second side surfaces 64.

As shown in FIGS. 3 to 5, the top surface 61 and the bottom surface 62 are spaced apart from each other in the thickness direction z. The top surface 61 and the bottom surface 62 face away from each other in the thickness direction z. Each of the top surface 61 and the bottom surface 62 is flat (or approximately flat).

As shown in FIGS. 3 to 5, the pair of first side surfaces 63 are connected to the top surface 61 and the bottom surface 62, and are spaced apart from each other in the first direction x. The first terminals 3 are exposed from one of the pair of first side surfaces 63, which is located on one side in the first direction x. The second terminals 4 are exposed from the other one of the pair of first side surfaces 63, which is located on the other side in the first direction x.

As shown in FIGS. 3 to 5, each of the first side surfaces 63 includes a first upper portion 631, a first lower portion 632, and a first intermediate portion 633. One end of the first upper portion 631 in the thickness direction z is connected to the top surface 61, and the other end thereof in the thickness direction z is connected to the first intermediate portion 633. The first upper portion 631 is inclined relative to the top surface 61. One end of the first lower portion 632 in the thickness direction z is connected to the bottom surface 62, and the other end thereof in the thickness direction z is connected to the first intermediate portion 633. The first lower portion 632 is inclined relative to the bottom surface 62. One end of the first intermediate portion 633 in the thickness direction z is connected to the first upper portion 631, and the other end thereof in the thickness direction z is connected to the first lower portion 632. The first intermediate portion 633 is along both of the thickness direction z and the second direction y. As viewed in the thickness direction z, the first intermediate portion 633 is located more outward than the top surface 61 and the bottom surface 62. Portions of the first terminals 3 or portions of the second terminals 4 are exposed from the first intermediate portion 633.

As shown in FIGS. 3 to 5, the pair of second side surfaces 64 are connected to the top surface 61 and the bottom surface 62, and are spaced apart from each other in the second direction y. As shown in FIGS. 1 and 2, the first die pad 21, the second die pad 22, the first terminals 3, and the second terminals 4 are located away from the pair of second side surfaces 64.

As shown in FIGS. 3 to 5, each of the second side surfaces 64 includes a second upper portion 641, a second lower portion 642, and a second intermediate portion 643. One end of the second upper portion 641 in the thickness direction z is connected to the top surface 61, and the other end thereof in the thickness direction z is connected to the second intermediate portion 643. The second upper portion 641 is inclined relative to the top surface 61. One end of the second lower portion 642 in the thickness direction z is connected to the bottom surface 62, and the other end thereof in the thickness direction z is connected to the second intermediate portion 643. The second lower portion 642 is inclined relative to the bottom surface 62. One end of the second intermediate portion 643 in the thickness direction z is connected to the second upper portion 641, and the other end thereof in the thickness direction z is connected to the second lower portion 642. The second intermediate portion 643 is along both of the thickness direction z and the second direction y. As viewed in the thickness direction z, the second intermediate portion 643 is located more outward than the top surface 61 and the bottom surface 62.

A motor driver circuit for an inverter is typically configured with a half-bridge circuit including a low-side (low-potential-side) switching element and a high-side (high-potential-side) switching element. The following description is provided with an assumption that these switching elements are MOSFETs. Note that the reference potential of the source of the low-side switching element and the reference potential of the gate driver for driving the low-side switching element are both ground. On the other hand, the reference potential of the source of the high-side switching element and the reference potential of the gate driver for driving the high-side switching element both correspond to a potential at an output node of the half-bridge circuit. Because the potential at the output node varies according to the drive of the high-side switching element and the low-side switching element, the reference potential of the gate driver for driving the high-side switching element varies as well. When the high-side switching element is on, the reference potential is equivalent to the voltage applied to the drain of the high-side switching element (e.g., 600 V or higher). In the semiconductor device A1, the ground of the first semiconductor element 11 is spaced apart from the ground of the second semiconductor element 12. Accordingly, in the case where the semiconductor device A1 is used as the gate driver for driving the high-side switching element, a voltage equivalent to the voltage applied to the drain of the high-side switching element is transiently applied to the ground of the second semiconductor element 12.

The following describes advantages of the semiconductor device A1.

The semiconductor device A1 includes the insulating element 13 that insulates the first circuit including the first semiconductor element 11 mounted on the first die pad 21 from the second circuit including the second semiconductor element 12 mounted on the second die pad 22. The insulating element 13 is mounted on the specific die pad 20 (the first die pad 21 in the semiconductor device A1). This improves the dielectric strength of each of the first circuit and the second circuit when there is a difference between the source voltage supplied to the first semiconductor element 11 and the source voltage supplied to the second semiconductor element 12.

The semiconductor device A1 further includes the first wires 51 bonded to the insulating element 13 and the specific semiconductor element 10 (the second semiconductor element 12 in the semiconductor device A1). The first wires 51 are covered with the sealing resin 6. As shown in FIG. 8, each of the first wires 51 has a first upright section 511, a first inclined section 512, a first extended section 513, a first bent section 514, and a second bent section 515. The inclination angle β1 of the first extended section 513 relative to the plane along the first direction x and the second direction y is smaller than the inclination angle α1 of the first inclined section 512 relative to the said plane. As such, the first wire 51 provides a framework structure having the first bent section 514 and the second bent section 515 as contacts. In this way, when the sealing resin 6 is formed during the manufacturing process of the semiconductor device A1, the first wire 51 is less likely to be deformed by the flow of a molten resin. As a result, the distance between the insulating element 13 and the first extended section 513 is increased. Thus, the semiconductor device A1 is capable of improving the dielectric strength.

As shown in FIG. 8, the boundary 513A between the first extended section 513 and the first bent section 514 is farther away from the insulating element 13 than the boundary 513B between the first extended section 513 and the second bent section 515 in the thickness direction z. In this way, as viewed in the thickness direction z, the distance in the thickness direction z between the insulating element 13 and the portion of the first extended section 513 that overlaps with the insulating element 13 is larger than the distance in the thickness direction z between the other portion of the first extended section 513 and the insulating element 13. This contributes to the improvement of the dielectric strength of the semiconductor device A1.

As shown in FIG. 8, the boundary 512B between the first inclined section 512 and the second bent section 515 is located away from the specific semiconductor element 10 as viewed in the thickness direction z. This prevents the first wire 51 from becoming too long while improving the dielectric strength of the semiconductor device A1.

The semiconductor device A1 further includes the second wires 52 bonded to the insulating element 13 and the semiconductor element (the first semiconductor element 11 in the semiconductor device A1) mounted on the specific die pad 20. The second wires 52 are covered with the sealing resin 6. As shown in FIG. 10, each of the second wires 52 has a second upright section 521, a second inclined section 522, a second extended section 523, a third bent section 524, and a fourth bent section 525. The inclination angle β2 of the second extended section 523 relative to the plane along the first direction x and the second direction y is smaller than the inclination angle α2 of the second inclined section 522 relative to the said plane. As such, the second wire 52 provides a framework structure having the third bent section 524 and the fourth bent section 525 as contacts. In this way, when the sealing resin 6 is formed during the manufacturing process of the semiconductor device A1, the second wire 52 is less likely to be deformed by the flow of a molten resin. As a result, the distance between the insulating element 13 and the second extended section 523 is increased, which makes it possible to further improve the dielectric strength of the semiconductor device A1.

As shown in FIG. 10, the boundary 522B between the second inclined section 522 and the fourth bent section 525 is located away from the semiconductor element mounted on the specific die pad 20, as viewed in the thickness direction z. This prevents the second wire 52 from becoming too long while improving the dielectric strength of the semiconductor device A1.

The insulating element 13 is located between the first semiconductor element 11 and the second semiconductor element 12 in the first direction x. The length L2 (see FIG. 10) of the second extended section 523 of the second wire 52 is smaller than the length L1 (see FIG. 8) of the first extended section 513 of the first wire 51. This makes it possible to further decrease the distance between the insulating element 13 and the semiconductor element mounted on the specific die pad 20 while improving the dielectric strength of the semiconductor device A1. As a result, the semiconductor device A1 is prevented from increasing in size.

In the semiconductor device A1, the first terminals 3 are exposed from a first side surface 63, which is one of the pair of first side surfaces 63 of the sealing resin 6 and located on one side in the first direction x. The second terminals 4 are exposed from the other one of the pair of first side surfaces 63, which is located on the other side in the first direction x. In this case, the first die pad 21, the second die pad 22, the first terminals 3, and the second terminals 4 are located away from the pair of second side surfaces 64 of the sealing resin 6. As such, in the semiconductor device A1, no metal members such as island supports are exposed from the pair of second side surfaces 64. With this configuration, there are no metal members exposed from the sealing resin 6 near the second terminals 4 that receive application of higher voltage than the first terminals 3. Thus, the semiconductor device A1 is capable of further improving the dielectric strength.

Figure 18:
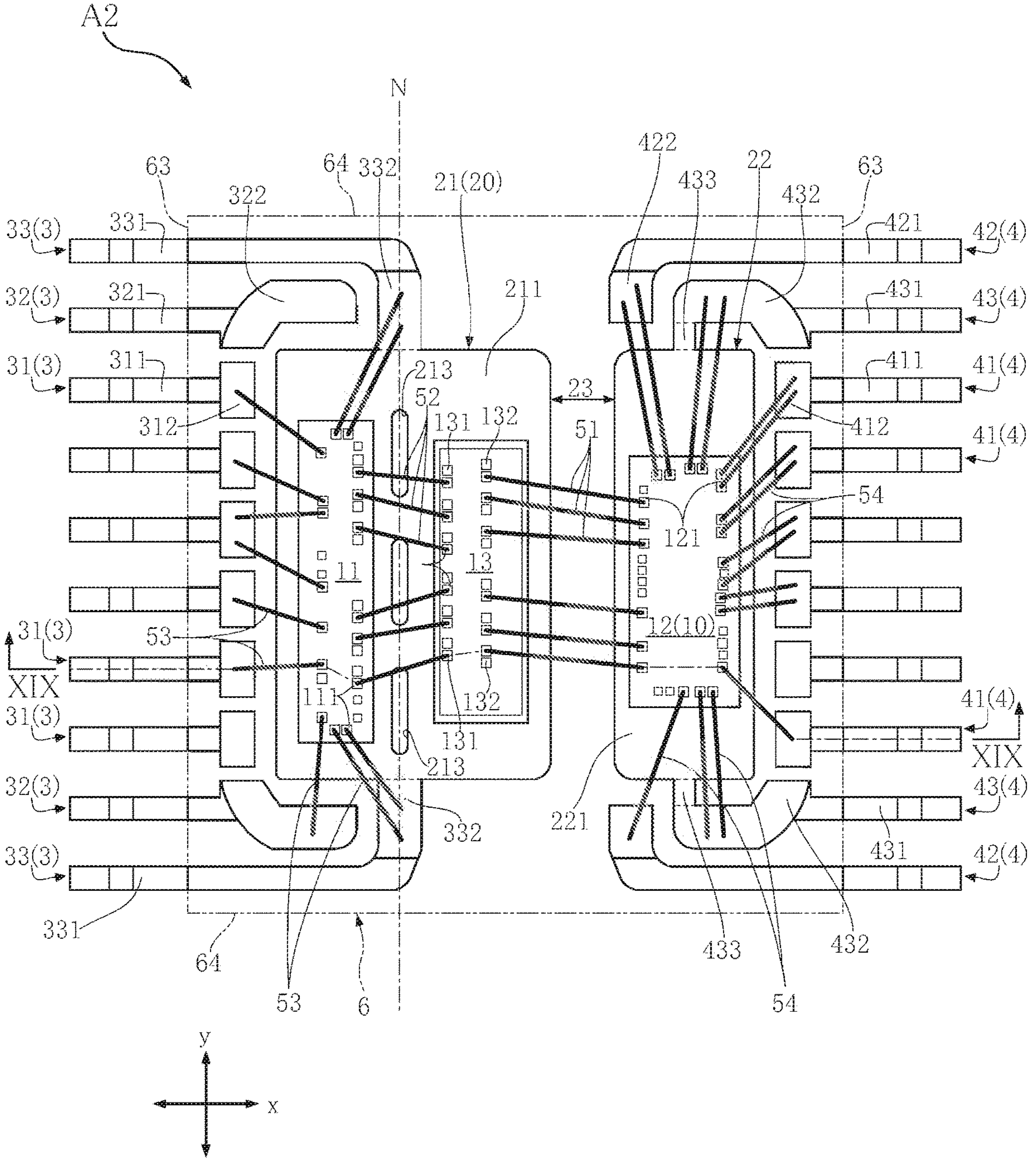
FIG. 18 is a plan view illustrating a semiconductor device according to a second embodiment of the present disclosure, as seen through a sealing resin.
Figure 19:
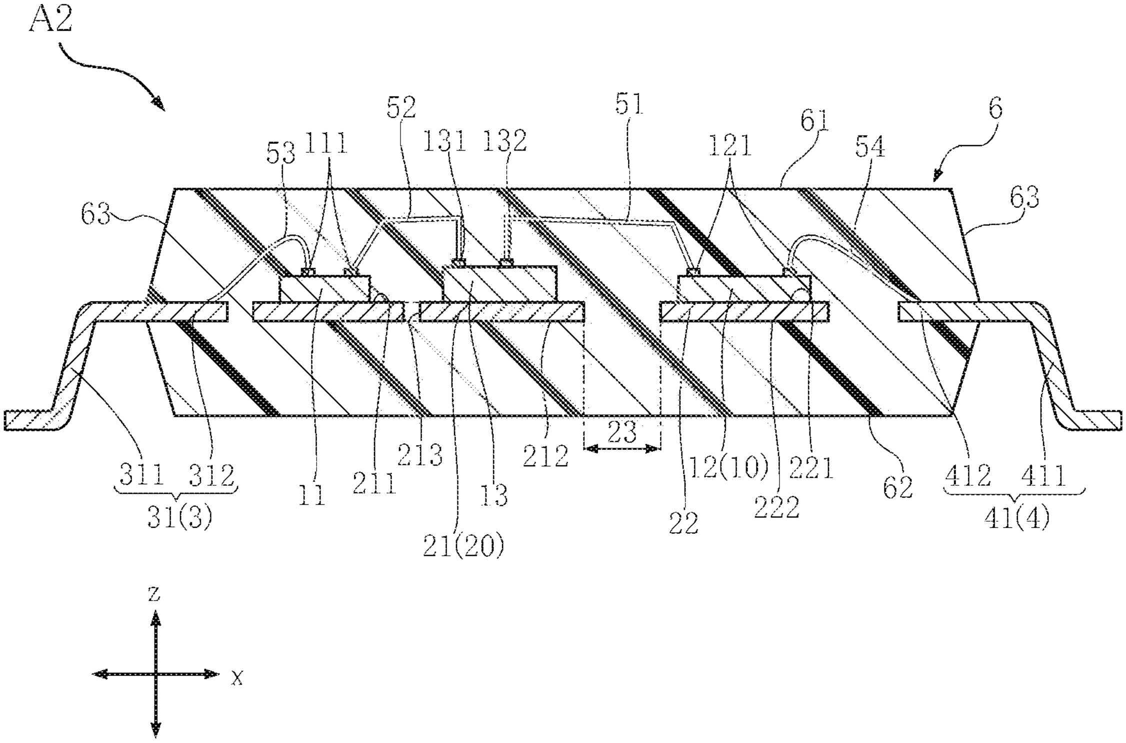
FIG. 19 is a cross-sectional view taken along line XIX-XIX in FIG. 18.

The following describes a semiconductor device A2 according to a second embodiment of the present disclosure, with reference to FIGS. 18 and 19. In these figures, elements that are the same as or similar to the elements of the semiconductor device A1 described above are provided with the same reference signs, and descriptions thereof are omitted. FIG. 18 shows the sealing resin 6 in phantom for convenience of understanding. In FIG. 18, the sealing resin 6 is indicated by an imaginary line.

The semiconductor device A2 is different from the semiconductor device A1 in the configuration of the first die pad 21.

As shown in FIGS. 18 and 19, the specific die pad 20 (the first die pad 21 in the semiconductor device A2) is formed with a plurality of holes 213. The holes 213 are formed in the area of the first die pad 21 located between the first semiconductor element 11 and the insulating element 13 in the first direction x. Although three holes 213 are formed in the semiconductor device A2, the number of holes 213 is not limited to this. Each of the holes 213 is elongated in the second direction y. The holes 213 may be provided in any shape. As shown in FIG. 18, on the first die pad 21, the pair of first support terminals 33 and the holes 213 are arranged on a straight line N (single-dot chain line) along the second direction y.

The following describes advantages of the semiconductor device A2.

The semiconductor device A2 includes the insulating element 13 that insulates the first circuit including the first semiconductor element 11 mounted on the first die pad 21 from the second circuit including the second semiconductor element 12 mounted on the second die pad 22. The insulating element 13 is mounted on the specific die pad 20 (the first die pad 21 in the semiconductor device A2). The semiconductor device A2 further includes the first wires 51 bonded to the insulating element 13 and the specific semiconductor element 10 (the second semiconductor element 12 in the semiconductor device A2). The first wires 51 are covered with the sealing resin 6. As shown in FIG. 8, each of the first wires 51 has a first upright section 511, a first inclined section 512, a first extended section 513, a first bent section 514, and a second bent section 515. The inclination angle β1 of the first extended section 513 relative to the plane along the first direction x and the second direction y is smaller than the inclination angle α1 of the first inclined section 512 relative to the said plane. Thus, the semiconductor device A2 is also capable of improving the dielectric strength. Furthermore, the semiconductor device A2 adopts a configuration common to the semiconductor device A1, and thereby achieves advantages similar to the semiconductor device A1.

The specific die pad 20 of the semiconductor device A2 is formed with the holes 213. As viewed in the thickness direction z, the first die pad 21 is larger in area than the second die pad 22. Accordingly, in the step of forming the sealing resin 6, voids are likely to be created in the area of the sealing resin 6 near the specific die pad 20. In view of this, the specific die pad 20 is formed with the holes 213, so that when a molten resin is injected into a mold to form the sealing resin 6, the molten resin will sufficiently fill the mold. In other words, the semiconductor device A2 can prevent creation of voids in the sealing resin 6 more effectively than the configuration where the specific die pad 20 has no holes 213.

Figure 20:
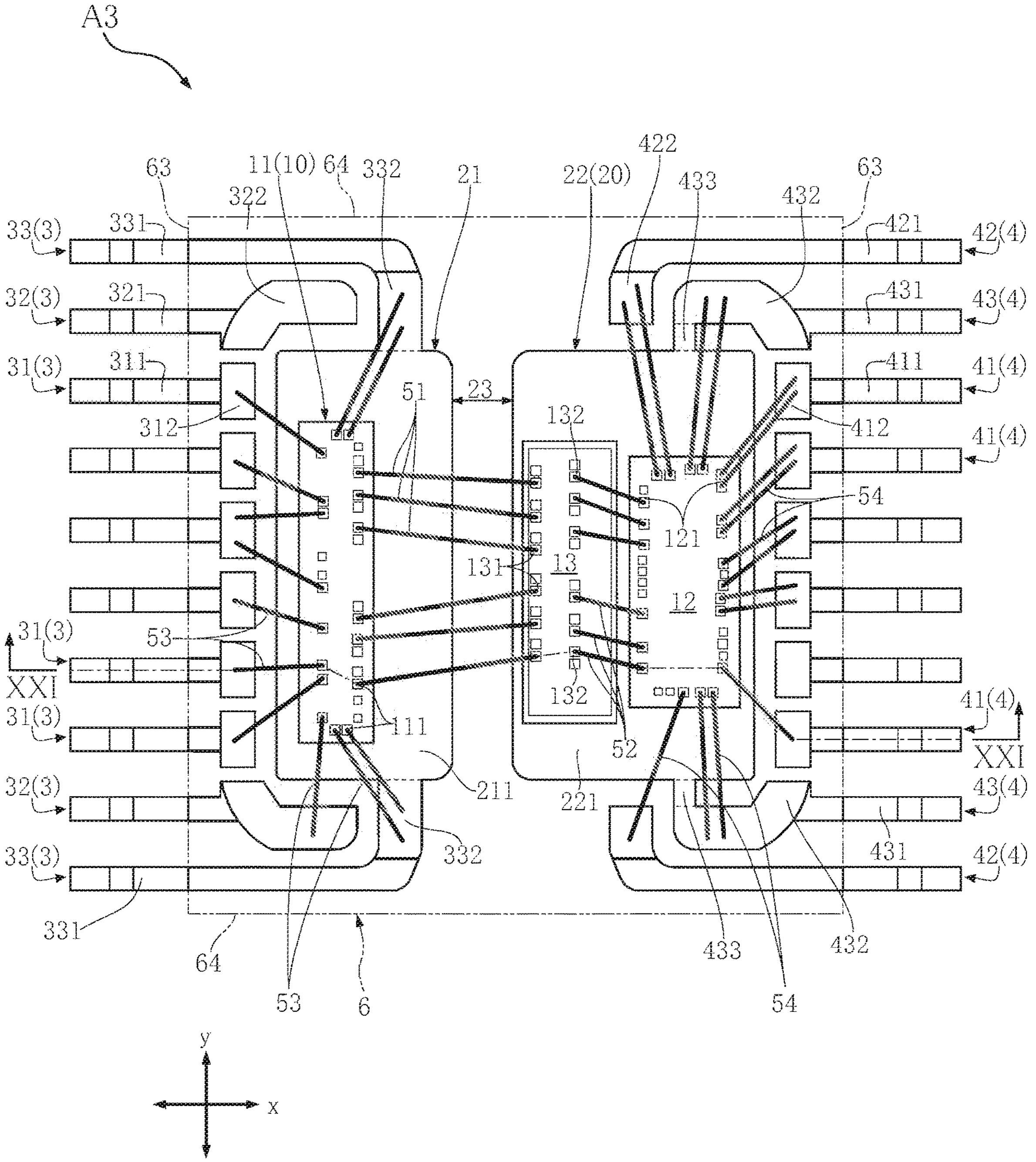
FIG. 20 is a plan view illustrating a semiconductor device according to a third embodiment of the present disclosure, as seen through a sealing resin.

The following describes a semiconductor device A3 according to a third embodiment of the present disclosure, with reference to FIGS. 20 to 23. In these figures, elements that are the same as or similar to the elements of the semiconductor device A1 described above are provided with the same reference signs, and descriptions thereof are omitted. FIG. 20 shows the sealing resin 6 in phantom for convenience of understanding. In FIG. 20, the sealing resin 6 is indicated by an imaginary line.

The semiconductor device A3 is different from the semiconductor device A1 in the arrangement of the insulating element 13.

Figure 21:
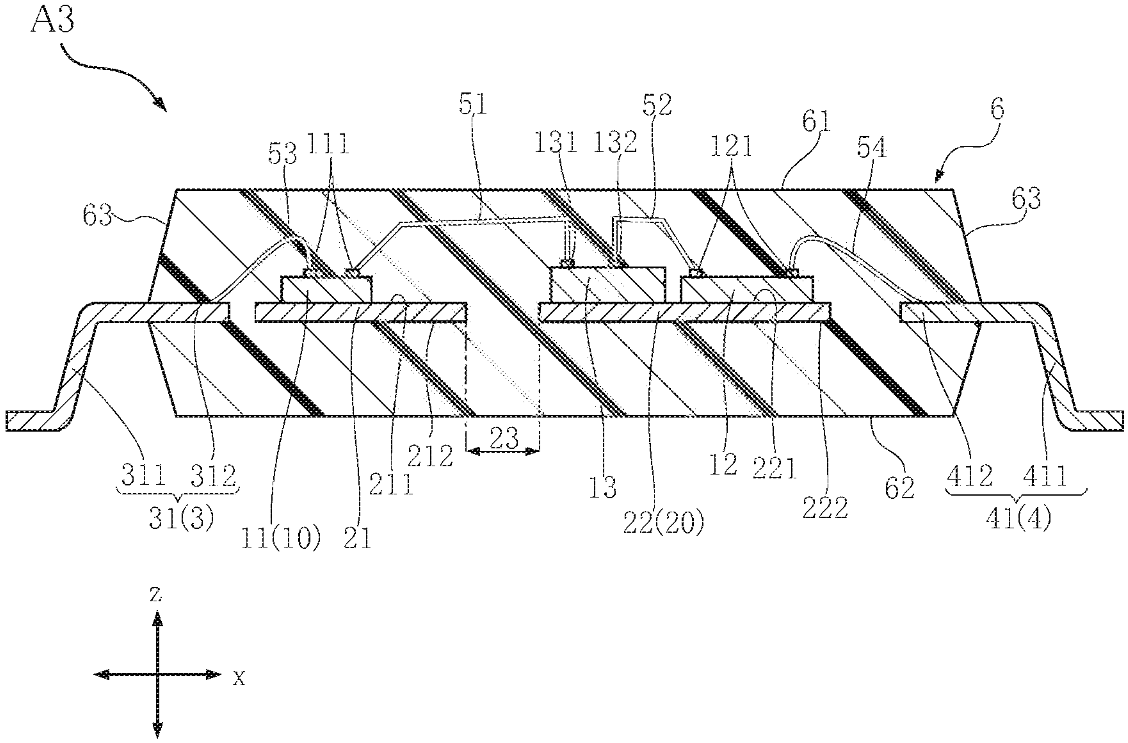
FIG. 21 is a cross-sectional view taken along line XXI-XXI in FIG. 20.

As shown in FIGS. 20 and 21, the insulating element 13 is mounted on the second obverse surface 221 of the second die pad 22. In the semiconductor device A3, the second die pad 22 corresponds to the specific die pad 20, and the first semiconductor element 11 corresponds to the specific semiconductor element 10.

Figure 22:
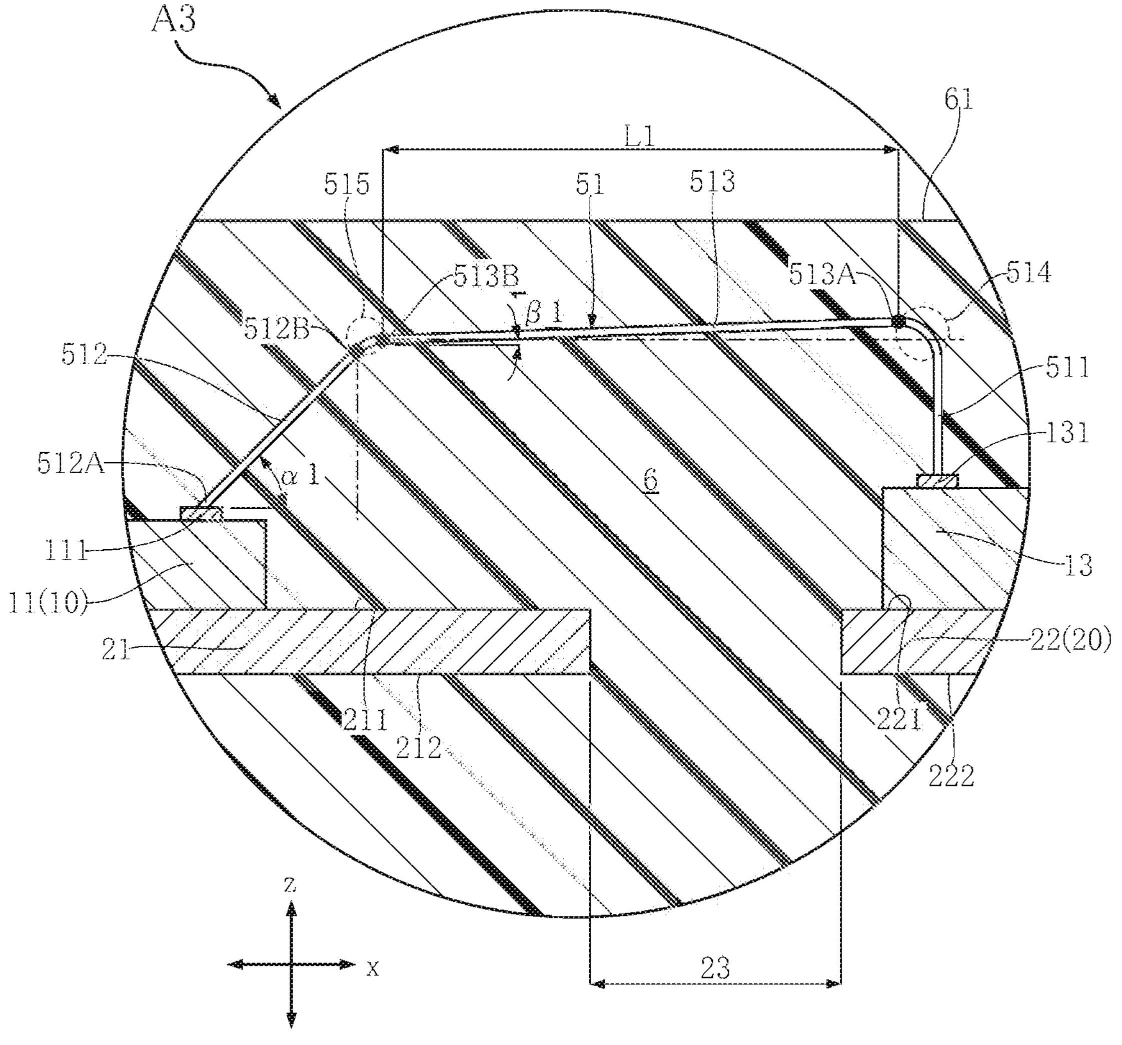
FIG. 22 is a partially enlarged view of FIG. 21.

As shown in FIG. 22, in the semiconductor device A3, each of the first wires 51 is bonded to one of the first electrodes 131 of the insulating element 13 and one of the electrodes 111 of the first semiconductor element 11. As such, the first upright section 511 of each of the first wires 51 rises from one of the first electrodes 131 of the insulating element 13 in the thickness direction z. The first inclined section 512 of each of the first wires 51 is inclined relative to the thickness direction z and extends from one of the electrodes 111 of the first semiconductor element 11 toward the insulating element 13.

Figure 23:
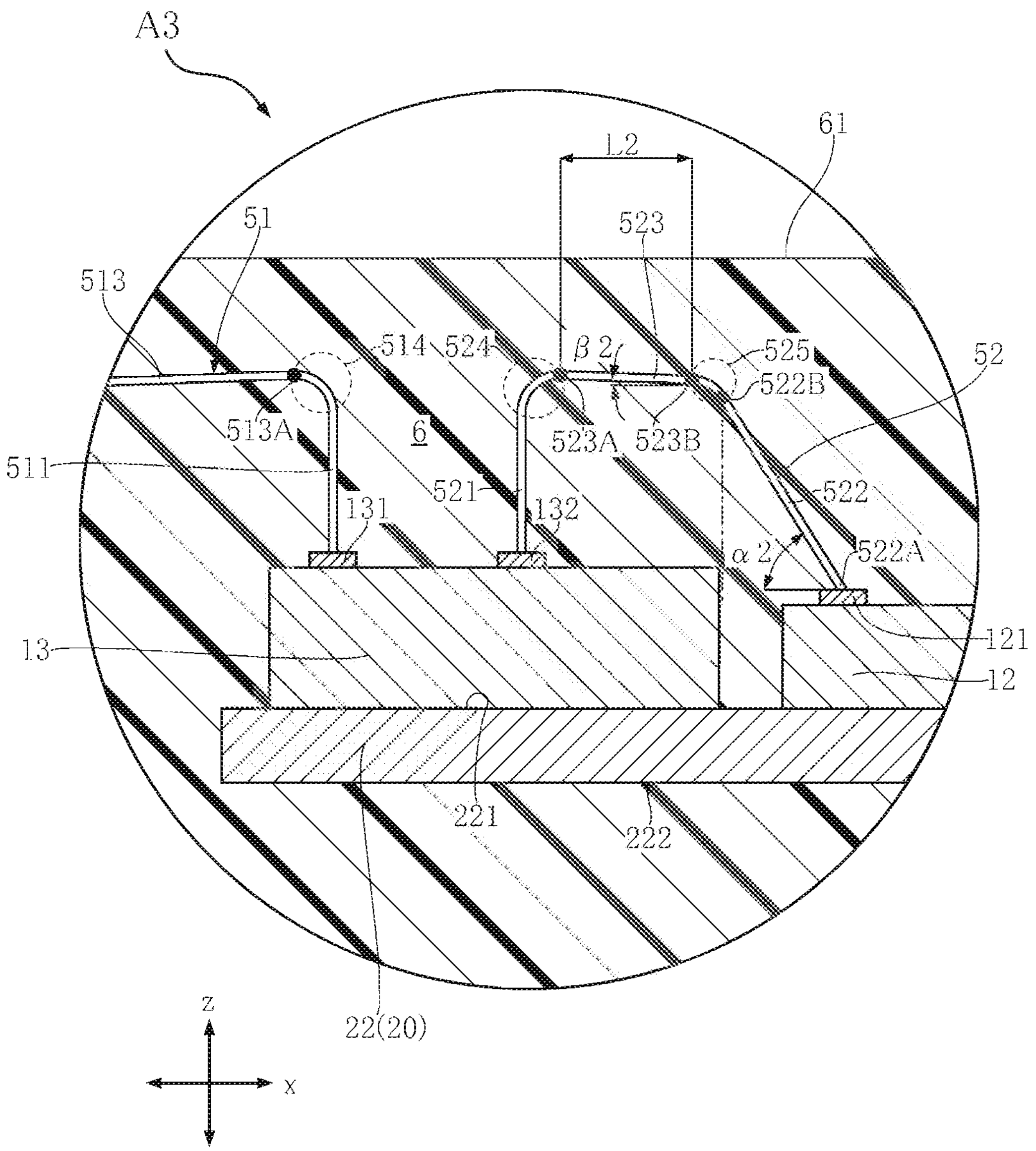
FIG. 23 is a partially enlarged view of FIG. 21.

As shown in FIG. 23, in the semiconductor device A3, each of the second wires 52 is bonded to one of the second electrodes 132 of the insulating element 13 and one of the electrodes 121 of the second semiconductor element 12. As such, the second upright section 521 of each of the second wires 52 rises from one of the second electrodes 132 of the insulating element 13 in the thickness direction z. The second inclined section 522 of each of the second wires 52 is inclined relative to the thickness direction z and extends from one of the electrodes 121 of the second semiconductor element 12 toward the insulating element 13.

The following describes advantages of the semiconductor device A3.

The semiconductor device A3 includes the insulating element 13 that insulates the first circuit including the first semiconductor element 11 mounted on the first die pad 21 from the second circuit including the second semiconductor element 12 mounted on the second die pad 22. The insulating element 13 is mounted on the specific die pad 20 (the second die pad 22 in the semiconductor device A3). The semiconductor device A3 further includes the first wires 51 bonded to the insulating element 13 and the specific semiconductor element 10 (the first semiconductor element 11 in the semiconductor device A3). The first wires 51 are covered with the sealing resin 6. As shown in FIG. 22, each of the first wires 51 has a first upright section 511, a first inclined section 512, a first extended section 513, a first bent section 514, and a second bent section 515. The inclination angle $\beta 1$ of the first extended section 513 relative to the plane along the first direction x and the second direction y is smaller than the inclination angle $\alpha 1$ of the first inclined section 512 relative to the said plane. Thus, the semiconductor device A3 is also capable of improving the dielectric strength. Furthermore, the semiconductor device A3 adopts a configuration common to the semiconductor device A1, and thereby achieves advantages similar to the semiconductor device A1.

The present disclosure is not limited to the foregoing embodiments. Various design changes can be made to the specific configurations of the elements of the present disclosure.

| REFERENCE SIGNS |
| --- |
| A1, A2, A3: Semiconductor device |
| 10: Specific semiconductor element |
| 11: First semiconductor element (Control element) |
| 111: Electrode |
| 12: Second semiconductor element (Drive element) |
| 121: Electrode |
| 13: Insulating element 131: First electrode |
| 132: Second electrode 133: Passivation film |
| 134: Surface protection film 134A: First film |
| 134B: Second film 20: Specific die pad |
| 21: First die pad 211: First obverse surface |
| 212: First reverse surface 213: Hole |
| 22: Second die pad 221: Second obverse surface |
| 222: Second reverse surface 23: Pad gap |
| 3: First terminal 31: First intermediate terminal |
| 311: Lead section 312: Pad section |
| 32: First side terminal 321: Lead section |
| 322: Pad section 33: First support terminal |
| 331: Lead section 332: Pad section |
| 4: Second terminal 41: Second intermediate terminal |
| 411: Lead section 42: Pad section |
| 42: Second side terminal 421: Lead section |
| 422: Pad section 43: Second support terminal |
| 431: Lead section 432: Pad section |
| 433: Connecting section 51: First wire |
| 511: First upright section 512: First inclined section |
| 512A: First tip 512B: Boundary |
| 513: First extended section 513A, 513B: Boundary |
| 514: First bent section 515: Second bent section |
| 52: Second wire 521: Second upright section |
| 522: Second inclined section 522A: Second tip |
| 522B: Boundary 523: Second extended section |
| 523A, 523B: Boundary 524: Third bent section |
| 525: Fourth bent section 53: Third wire |
| 54: Fourth wire 6: Sealing resin |
| 61: Top surface 62: Bottom surface |
| 63: First side surface 631: First upper portion |
| 632: First lower portion 633: First intermediate portion |

-continued

| REFERENCE SIGNS |
| --- |
| 64: Second side surface 641: Second upper portion |
| 642: Second lower portion 643: Second intermediate portion |
| 80: Capillary 81: Wire |
| z: Thickness direction x: First direction y: Second direction |

The invention claimed is:

1. A semiconductor device comprising:

a first die pad;

a second die pad spaced apart from the first die pad in a first direction and having a potential different from a potential of the first die pad;

a semiconductor element mounted on the first die pad and constituting a first circuit together with the first die pad;

a semiconductor element mounted on the second die pad and constituting a second circuit together with the second die pad;

an insulating element mounted on one of the first die pad and the second die pad, relaying transmission and reception of a signal between the first circuit and the second circuit, and insulating the first circuit and the second circuit from each other, a first wire bonded to the insulating element and the semiconductor element mounted on the other of the first die pad and the second die pad; and a sealing resin covering the first die pad, the second die pad, the semiconductor element mounted on the one of the first die pad and the second die pad, the semiconductor element mounted on the other of the first die pad and the second die pad, and the insulating element, the sealing resin insulating the first die pad and the second die pad from each other, wherein the first wire bridges across a pad gap provided between the first die pad and the second die pad in the first direction, the first wire has a first upright section, a first inclined section, a first extended section, a first bent section, and a second bent section, the first upright section rising from the insulating element in a thickness direction of the one of the first die pad and the second die pad, the first inclined section being inclined relative to the thickness direction and extending from the semiconductor element mounted on the other of the first die pad and the second die pad toward the insulating element, the first extended section being located between the first upright section and the first inclined section as viewed in the thickness direction, the first bent section being connected to the first upright section and the first extended section, the second bent section being connected to the first inclined section and the first extended section, an inclination angle of the first extended section relative to a plane perpendicular to the thickness direction is smaller than an inclination angle of the first inclined section relative to the plane, a length of the first extended section is greater than a length of each of the first upright section, the first inclined section, the first bent section, and the second bent section, each of the first bent section and the second bent section includes a curved portion, in an entirety of the first wire, a boundary between the first extended section and the first bent section is located farthest from the one of the first die pad and the second die pad in the thickness direction, and an inclination angle of the first upright section relative to the plane is greater than each of the inclination angle of the first extended section and the inclination angle of the first inclined section.

2. The semiconductor device according to claim 1, wherein the first extended section bridges across the pad gap.

3. The semiconductor device according to claim 2, wherein in the thickness direction, the boundary between the first extended section and the first bent section is farther away from the insulating element than a boundary between the first extended section and the second bent section.

4. The semiconductor device according to claim 2, wherein as viewed in the thickness direction, a boundary between the first inclined section and the second bent section is located away from the semiconductor element mounted on the other of the first die pad and the second die pad.

5. The semiconductor device according to claim 2, further comprising a second wire, wherein the insulating element is located between the semiconductor element mounted on the one of the first die pad and the second die pad and the semiconductor element mounted on the other of the first die pad and the second die pad in the first direction, the second wire is bonded to the insulating element and the semiconductor element mounted on the one of the first die pad and the second die pad, the second wire being covered with the sealing resin, the second wire has a second upright section, a second inclined section, a second extended section, a third bent section, and a fourth bent section, the second upright section rising from the insulating element in the thickness direction, the second inclined section being inclined relative to the thickness direction and extending from the semiconductor element mounted on the one of the first die pad and the second die pad toward the insulating element, the second extended section being located between the second upright section and the second inclined section as viewed in the thickness direction, the third bent section being connected to the second upright section and the second extended section, the fourth bent section being connected to the second inclined section and the second extended section, and the second extended section is shorter than the first extended section.

6. The semiconductor device according to claim 5, wherein an inclination angle of the second extended section relative to the plane is smaller than an inclination angle of the second inclined section relative to the plane.

7. The semiconductor device according to claim 6, wherein as viewed in the thickness direction, a boundary between the second inclined section and the fourth bent section is located away from the semiconductor element mounted on the one of the first die pad and the second die pad.

8. The semiconductor device according to claim 6, wherein the first wire has a first tip of the first inclined section that is bonded to the semiconductor element mounted on the other of the first die pad and the second die pad and a dimension of the first tip in the thickness direction decreases with distance from the first extended section, and the second wire has a second tip of the second inclined section that is bonded to the semiconductor element mounted on the one of the first die pad and the second die pad and a dimension of the second tip in the thickness direction decreases with distance from the second extended section.

9. The semiconductor device according to claim 5, wherein a source voltage supplied to the second circuit is higher than a source voltage supplied to the first circuit.

10. The semiconductor device according to claim 9, further comprising:

a plurality of first terminals each including a portion located on one side in the first direction relative to the first die pad; and a plurality of second terminals each including a portion located on another side in the first direction relative to the second die pad, wherein the plurality of first terminals are spaced apart from each other in a second direction perpendicular to the thickness direction and the first direction, at least one of the first terminals being electrically connected to the first circuit, the plurality of second terminals are spaced apart from each other in the second direction, at least one of the second terminals being electrically connected to the second circuit, the sealing resin has a pair of first side surfaces spaced apart from each other in the first direction, and a pair of second side surfaces spaced apart from each other in the second direction, and the first terminals are exposed from one of the pair of first side surfaces, and the second terminals are exposed from another one of the pair of first side surfaces.

11. The semiconductor device according to claim 10, wherein the second die pad overlaps with the first die pad as viewed in the first direction.

12. The semiconductor device according to claim 10, wherein the first die pad, the second die pad, the plurality of the first terminals, and the plurality of second terminals are located away from the pair of second side surfaces.

13. The semiconductor device according to claim 12, wherein as viewed in the thickness direction, each of the first terminals includes a portion protruding from the one of the first side surfaces along the first direction, and as viewed in the thickness direction, each of the second terminals includes a portion protruding from the other one of the first side surfaces along the first direction.

14. The semiconductor device according to claim 13, wherein the plurality of first terminals include a pair of first support terminals spaced apart from each other in the second direction, and the first die pad has a pair of first edges spaced apart from each other in the second direction, and the pair of first support terminals are connected to the pair of first edges, respectively.

15. The semiconductor device according to claim 14, wherein the plurality of second terminals include a pair of second support terminals spaced apart from each other in the second direction, and the second die pad has a pair of second edges spaced apart from each other in the second direction, and the pair of second support terminals are connected to the pair of second edges, respectively.

16. The semiconductor device according to claim 10, wherein the one of the first die pad and the second die pad is formed with a hole penetrating through in the thickness direction, and as viewed in the thickness direction, the hole is located between the insulating element and the semiconductor element mounted on the one of the first die pad and the second die pad.

17. The semiconductor device according to claim 1, wherein the insulating element is of an inductive type.

18. The semiconductor device according to claim 1, wherein the inclination angle of the first upright section is 90 degrees.

* * * * *